United States Patent
Khwa et al.

(10) Patent No.: US 9,564,216 B2
(45) Date of Patent: Feb. 7, 2017

(54) STRESS TRIM AND MODIFIED ISPP PROCEDURES FOR PCM

(71) Applicant: MACRONIX INTERNATIONAL CO., LTD., Hsinchu (TW)

(72) Inventors: Win-San Khwa, Taipei (TW); Tzu-Hsiang Su, Hsinchu (TW); Chao-I Wu, Hsinchu (TW); Hsiang-Pang Li, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/682,903

(22) Filed: Apr. 9, 2015

(65) Prior Publication Data

US 2016/0225446 A1 Aug. 4, 2016

Related U.S. Application Data

(60) Provisional application No. 62/110,204, filed on Jan. 30, 2015.

(51) Int. Cl.
*G11C 11/00* (2006.01)
*G11C 13/00* (2006.01)
(Continued)

(52) U.S. Cl.
CPC ....... *G11C 13/0069* (2013.01); *G11C 11/5678* (2013.01); *G11C 13/0004* (2013.01);
(Continued)

(58) Field of Classification Search
None
See application file for complete search history.

(56) References Cited

U.S. PATENT DOCUMENTS 6,732,221 B2  5/2004  Ban
8,626,996 B2  1/2014  Oh et al.
(Continued)

FOREIGN PATENT DOCUMENTS

TW  201111986 A  4/2011

OTHER PUBLICATIONS

Khwa, et al. "A Procedure to Reduce Cell Variation in Phase Change Memory for Improving Multi-Level-Cell Performances," 2015 IEEE International Memory Workshop (IMW), May 17-20, 2015, pp. 1-4.
(Continued)

*Primary Examiner* — Harry W Byrne
*Assistant Examiner* — Sultana Begum
(74) *Attorney, Agent, or Firm* — Haynes Beffel & Wolfeld LLP

(57) ABSTRACT

A memory circuit is described that includes an array of memory cells including a plurality of blocks. The circuit includes a controller including logic to execute program sequences for selected blocks in the plurality of blocks. The program sequences include patterns of program/verify cycles. The circuit includes logic to assign different patterns of program/verify cycles to different blocks in the plurality of blocks. The circuit includes logic to change a particular pattern assigned to a particular block in the plurality of blocks. The circuit includes logic to maintain statistics for blocks in the plurality of blocks, about performance of cells in the blocks in response to the patterns of program/verify cycles assigned to the blocks. The controller includes logic to apply a stress sequence to one of the selected blocks, the stress sequence including stress pulses applied to memory cells in the one of the selected blocks.

31 Claims, 23 Drawing Sheets

(51) Int. Cl.
*G11C 11/56* (2006.01)
*G11C 29/02* (2006.01)
*G11C 29/06* (2006.01)
*G11C 29/50* (2006.01)
G11C 29/04 (2006.01)

(52) U.S. Cl.
CPC ...... *G11C 13/0023* (2013.01); *G11C 13/0064* (2013.01); *G11C 29/028* (2013.01); *G11C 29/06* (2013.01); *G11C 29/50* (2013.01); *G11C 29/50008* (2013.01); G11C 2013/0066 (2013.01); G11C 2013/0083 (2013.01); G11C 2029/0409 (2013.01)

(56) References Cited

U.S. PATENT DOCUMENTS

| | | | |
|---|---|---|---|
| 2010/0214831 A1* | 8/2010 | Kim | G11C 11/56 365/163 |
| 2011/0078393 A1 | 3/2011 | Lin | |
| 2011/0273936 A1* | 11/2011 | Yu | G11C 16/16 365/185.33 |
| 2014/0215128 A1* | 7/2014 | Chin | G11C 11/5628 711/103 |

OTHER PUBLICATIONS

U.S. Appl. No. 14/566,453, filed Dec. 10, 2014 entitled "Method and Apparatus for Healing Phase Change Memory Devices," 32 pages.

\* cited by examiner

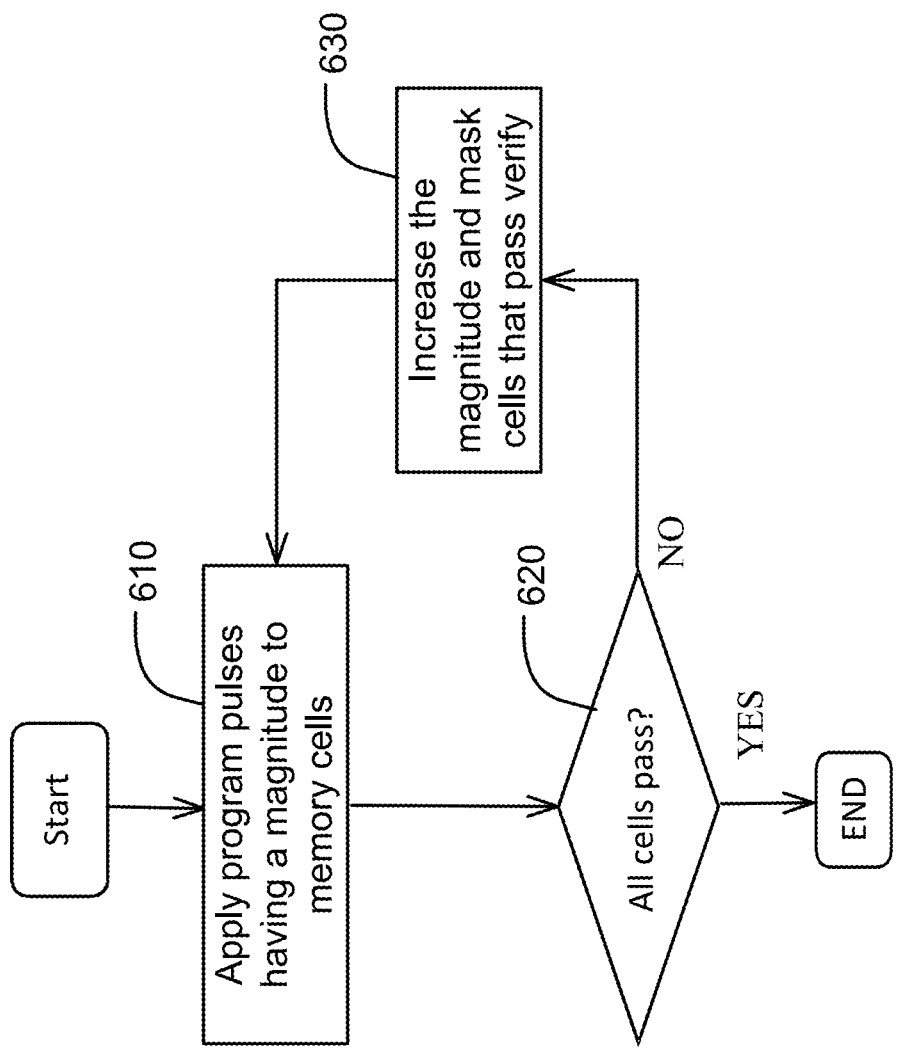

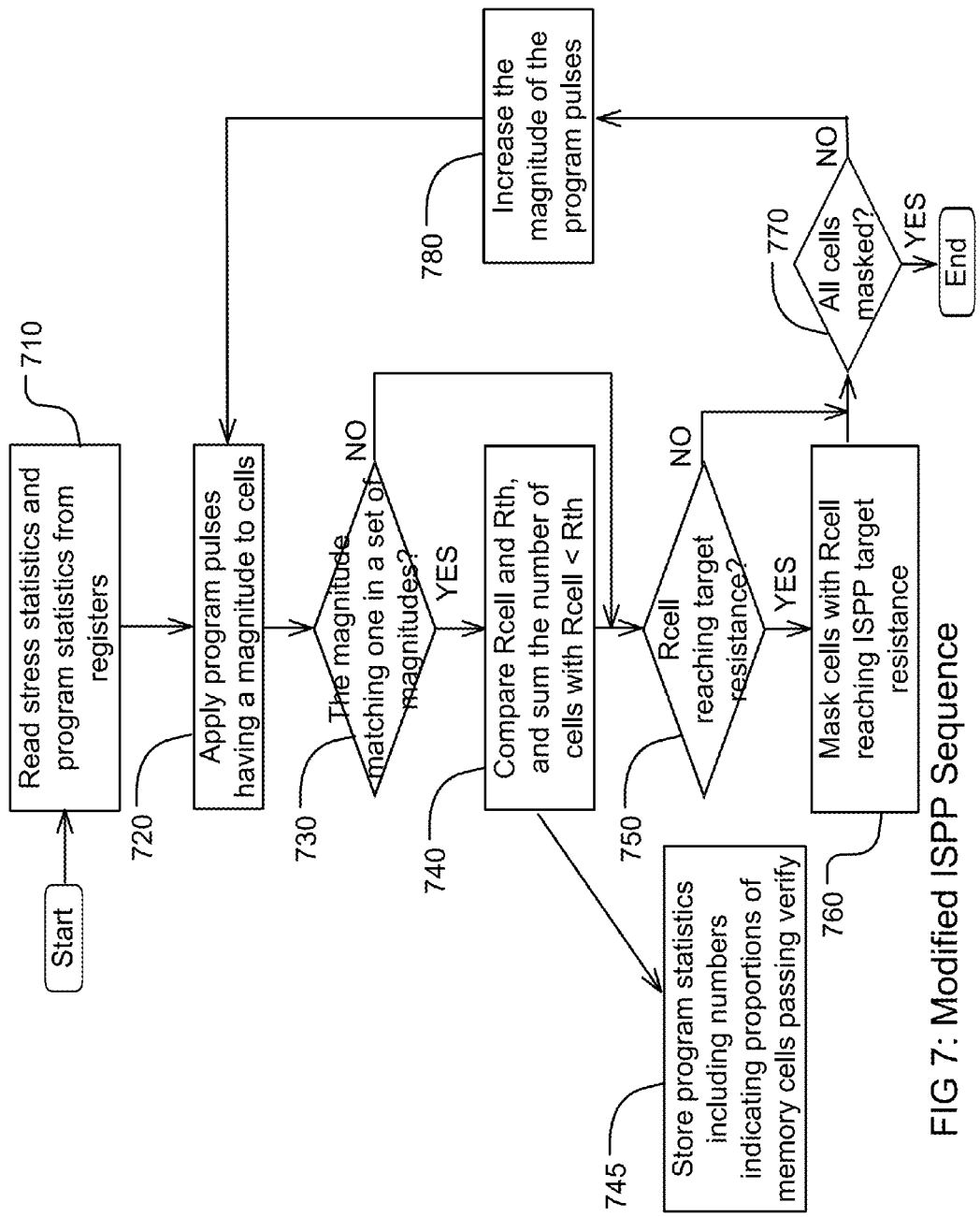
FIG 7: Modified ISPP Sequence

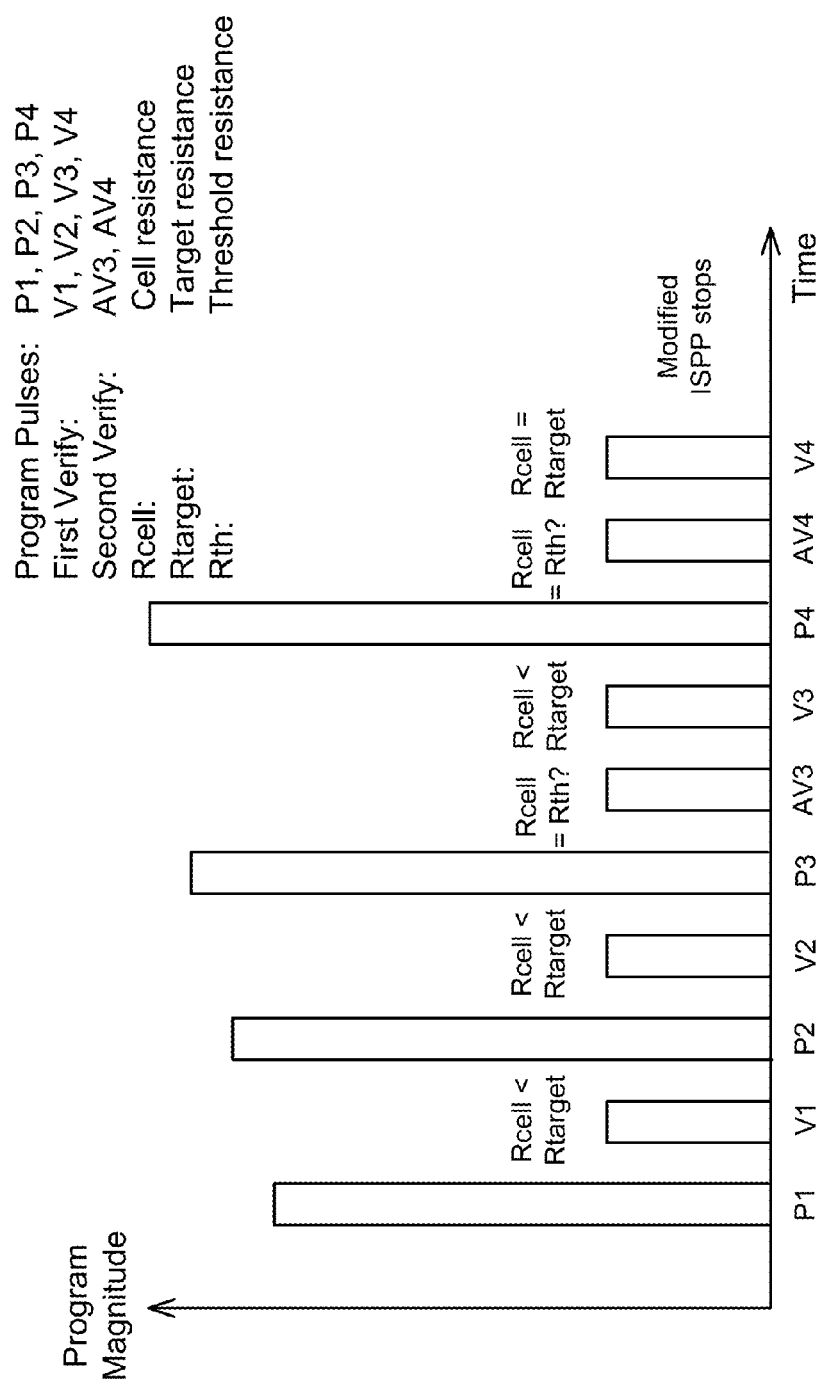
FIG 8: Modified ISPP Sequence

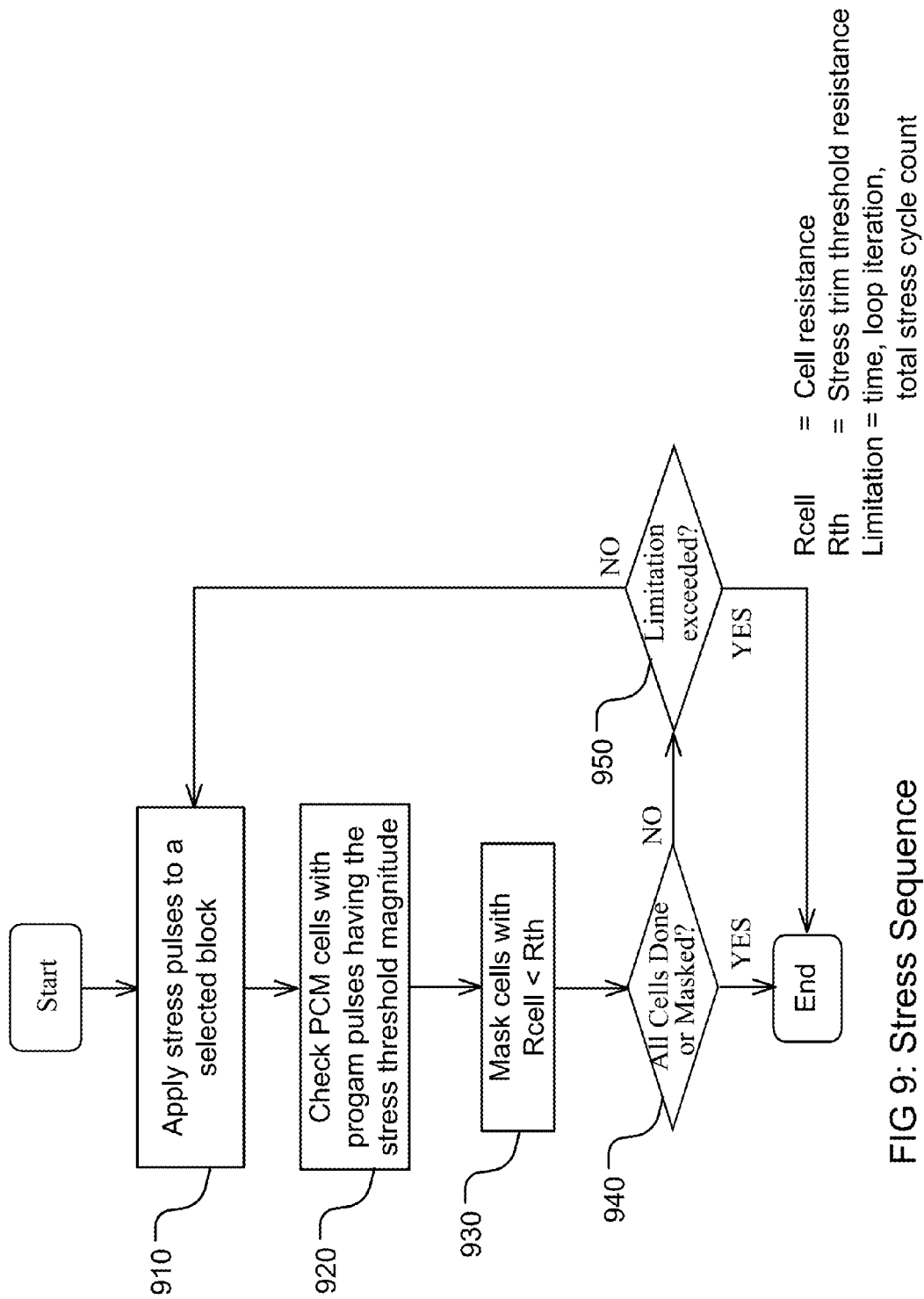

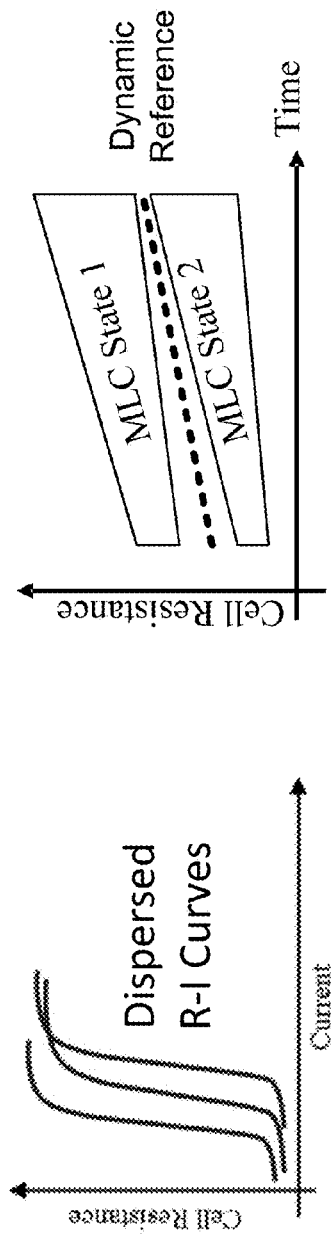
FIG. 14A: Wider resistance distribution after drift without stress trim
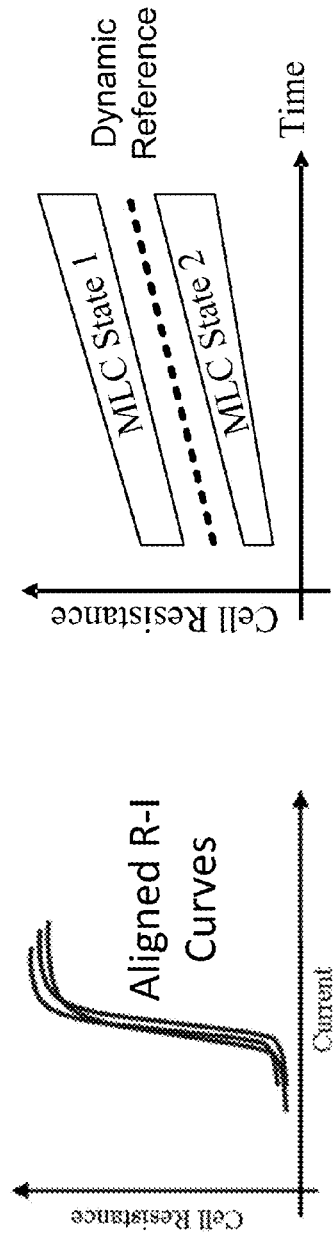
FIG. 14B: Narrower resistance distribution after drift with stress trim

STRESS TRIM AND MODIFIED ISPP PROCEDURES FOR PCM

RELATED APPLICATIONS

This application claims the benefit of U.S. Provisional Patent Application No. 62/110,204 filed on 30 Jan. 2015, which application is incorporated by reference as if fully set forth herein.

BACKGROUND

Field of the Technology

The present invention relates to high density memory devices based on phase change memory materials, and methods for operating such devices.

Description of Related Art

In a phase change memory (PCM), each memory cell includes a phase change memory element. The phase change memory element is made of phase change materials that exhibit a large resistivity contrast between crystalline (low resistivity) and amorphous (high resistivity) phases. Phase change materials may include alloys of materials such as germanium (Ge), antimony (Sb), tellurium (Te), gallium (Ga), indium (In), silver (Ag), selenium (Se), thallium (Ti), bismuth (Bi), tin (Sn), copper (Cu), palladium (Pd), lead (Pb), sulfur (S), and gold (Au).

In operation of a phase change memory element, an electrical current pulse passed through the phase change memory cell can set or reset the resistivity phase of the phase change memory element. To reset the memory element into the amorphous phase, an electrical current pulse with a large magnitude for a short time period can be used to heat up an active region of the memory element to a melting temperature, and then cool quickly causing it to solidify in the amorphous phase. To set the memory element into the crystalline phase, an electrical current pulse with a medium magnitude, which causes it to heat up to a crystallization transition temperature, and a longer cooling time period can be used allowing the active region to solidify in a crystalline phase. To read the state of the memory element, a small voltage is applied to the selected cell and the resulting electrical current is sensed.

Cell-to-cell variations in the performance of PCM cells and in other types of memory devices can be caused during manufacturing or during the life cycle of the memory devices. These variations result in the design of algorithms applied to program data that are relatively time consuming, to accommodate the range of performance that can be encountered on the devices. This can have an effect on the operating speed of the memory device. Also, these variations can reduce operating margins in the memory devices. This can reduce the amount of data that can be safely stored on the memory devices.

It is desirable to provide memory devices that can operate at higher speeds and with greater data densities. It is also desirable to provide memory devices with reduced cell-to-cell variations to improve reliability, especially in MLC (multi-level cell) operations.

SUMMARY

A memory circuit including an array of memory cells is described, which includes a controller having logic to execute a program sequence for a selected block in the array that includes a pattern of program/verify cycles. The controller can assign a pattern for the program/verify cycles on a block by block basis, using for example a register set storing a table associated with individual blocks in the array with variant patterns. Also, the controller can include logic that can change the pattern associated with particular blocks. This enables operation of the memory using program operations tailored to the performance characteristics of each block. The use of tailored program operations can improve operating speed and data density.

Also, the circuit can include logic to maintain statistics about performance of the blocks in the array. The statistics can be monitored to indicate whether the pattern associated with the individual blocks should be changed, whether to apply a stress sequence to alter the performance characteristics of cells in the block, or both.

The statistics can be used for performing memory management functions on memory cells, where the memory management functions can include wear leveling, hot and cold data allocation, and self-healing of memory cells. For instance, a controller on or off the memory circuit can be configured to perform SMART (Self-Monitoring, Analysis and Reporting Technology) operations that use the stress statistics to detect and report health status of the set of phase change memory cells. Based on the reported health status, the controller can decide whether or how to perform memory management functions on the memory cells. The memory management functions can include wear leveling such as described in U.S. Pat. No. 6,732,221, hot and cold data allocation such as described in U.S. Pat. No. 8,626,996, and self-healing operations on phase change memory cells such as described in U.S. patent application Ser. No. 14/566,453.

Other aspects and advantages of the present technology can be seen on review of the drawings, the detailed description and the claims, which follow.

BRIEF DESCRIPTION OF THE DRAWINGS

FIG. 6 is a simplified flowchart of an ISPP sequence.

FIG. 7 is a simplified flowchart for executing program sequences for selected blocks in a plurality of blocks, to program a memory cell in the selected blocks and to gather statistics to determine conditions for executing a stress sequence for one of the selected blocks.

FIG. 8 is a graph showing example program and verify pulses in a modified ISPP sequence.

FIG. 9 is a simplified flowchart of a stress sequence.

FIGS. 14A and 14B illustrate resistance distributions after drift without and with stress trim operations, respectively.

DETAILED DESCRIPTION

Figure 1:
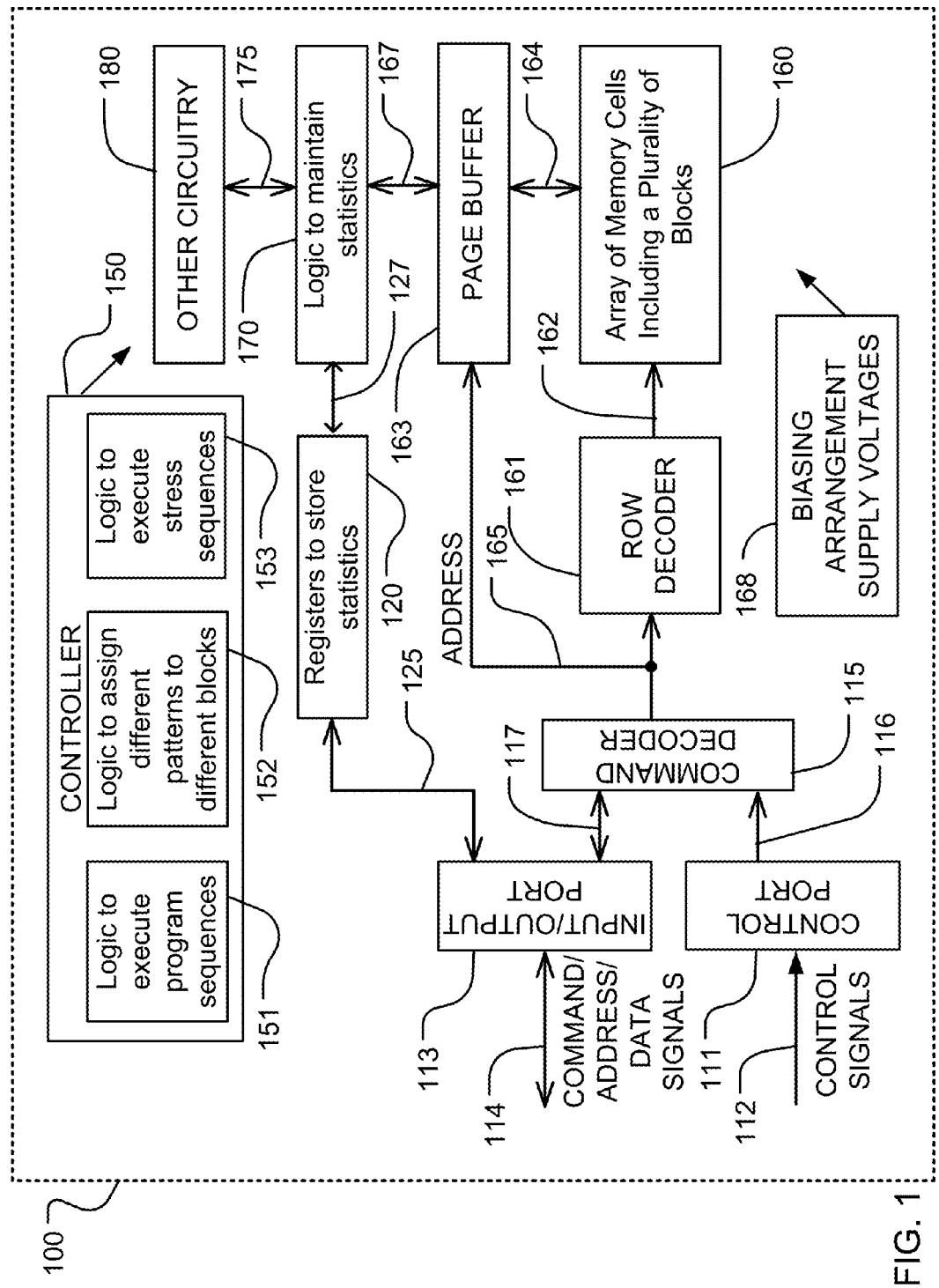
FIG. 1 illustrates a memory circuit in accordance with an embodiment of the present technology.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified block diagram of a memory circuit (e.g. 100) including an array of memory cells including a plurality of blocks (e.g. 160). In some embodiments, the array 160 can include single levels of cells (SLC). In other embodiments, the array 160 can include multiple levels of cells (MLC).

A controller 150, implemented for example as a state machine, provides signals to control the application of bias arrangement supply voltages generated or provided through the voltage supply or supplies in block 168 to carry out the various operations described herein. These operations include a program sequence and a stress sequence. The controller can be implemented using special-purpose logic circuitry as known in the art. In alternative embodiments, the controller comprises a general-purpose processor, which can be implemented on the same memory circuit, which executes a computer program to control the operations of the device. In yet other embodiments, a combination of special-purpose logic circuitry and a general-purpose processor can be utilized for implementation of the controller.

The controller 150 includes logic to execute program sequences for selected blocks in the plurality of blocks (e.g. 151), where the program sequences include patterns of program/verify cycles, as further described in connection with FIGS. 7 and 8. A selected block as used herein refers to a block in the plurality of blocks where at least one memory cell in the block is applied a program sequence of program/verify cycles that includes a program pulse which induces a change in resistance of the memory cell. The controller 150 includes logic to assign different patterns of program/verify cycles to different blocks in the plurality of blocks (e.g. 152), as further described in connection with FIG. 8A. The logic to assign different patterns can include a table accessible by the controller. The controller 150 includes logic to apply a stress sequence to one of the selected blocks (e.g. 153), where the stress sequence includes stress pulses applied to memory cells in the one of the selected blocks, as further described in connection with FIGS. 4 and 9. The controller 150 can include logic to execute program sequences and stress sequences to selected blocks in the plurality of blocks.

The memory circuit 100 includes logic to maintain statistics for blocks in the plurality of blocks, about performance of cells in the blocks in response to the patterns of program/verify cycles assigned to the blocks (e.g. 170), as further described in connection with FIGS. 7, 8 and 10-13. The memory circuit 100 includes circuitry to provide the statistics to the controller, and logic to respond to an external command to cause executing the logic to apply the stress sequence. The memory circuit 100 can also include logic to respond to an external command to cause stopping the stress sequence.

The memory circuit 100 also includes logic to change a particular pattern assigned to a particular block in the plurality of blocks, logic to apply a stress sequence to a selected block in the selected blocks to change performance characteristics of memory cells in the selected block, and logic to change the patterns assigned to the selected block after the stress sequence, and logic to cause executing the logic to apply the stress sequence in response to the statistics.

The table accessible by the controller can be stored in registers 120, which can store statistics for individual blocks in the plurality of blocks, about performance of cells in the blocks in response to the pattern of program/verify cycles assigned to the blocks. In implementations, the statistics can be stored for each block of memory cells, where a PCM chip can include multiple blocks and each block can include multiple pages of memory cells. The statistics can be stored in OOB (out of band) areas. An OOB area usually is an area dedicated for meta information, such as information about bad blocks, ECC (error correction code) data, erase counters, etc. An OOB area is not available to data payload. Alternatively, the statistics can be stored in registers external to the memory circuit, such as in a module controller in an operating system, or a storage system controller in an SD (secure digital) card or an eMMC (embedded Multi-Media Controller).

The statistics can include program statistics and stress statistics, generated and/or used by program and stress sequences. A program sequence can include a sequence of program pulses in program/verify cycles in the program sequence, where the sequence of program pulses has a range from a lowest magnitude to a highest magnitude. The program statistics can include, for each block in the plurality of blocks, a set of selected magnitudes in the range, and numbers indicating proportions of memory cells in the block that have resistance passing a verify threshold when program pulses having respective selected magnitudes in the set are applied to the memory cells. The program statistics can be used for determining whether or how to execute the stress sequences. The proportions of memory cells in the block passing verify can be expressed in percentage or fraction of the total number of memory cells on which the program sequences are executed.

The stress statistics can include a stress threshold resistance, a stress threshold magnitude, and a stress passing criterion based on the stress threshold resistance and the stress threshold magnitude. The stress passing criterion can include a number of memory cells having resistance values lower than or greater than the stress threshold resistance after program pulses having the stress threshold magnitude are applied to the memory cells. Alternatively, the stress passing criterion can include a number of memory cells having resistance values within a resistance range. The number of memory cells used in the stress passing criterion can be expressed in percentage or fraction of the total number of memory cells on which the stress trim operations are performed.

The stress threshold magnitude can include a magnitude to reset memory cells into an amorphous phase, and memory cells can have partially reset resistance values while program/erase cycles are repetitively applied to reset the memory cells. Corresponding to a stress threshold magnitude to reset memory cells, the stress threshold resistance can be 100 kilo-ohm, for example. Alternatively, the threshold magnitude can include a magnitude to set the memory cells into a crystalline phase, and memory cells can have partial set resistance values while program/erase cycles are repetitively applied to set the memory cells. Corresponding to the stress trim magnitude to set memory cells, the stress threshold resistance can be 1 mega-ohm, for example.

The stress threshold magnitude and the set of selected magnitudes can include pre-determined values (e.g. 150 uA, 175 uA, 200 uA), such that actual values of the magnitudes do not need to be stored for each block of memory cells, where uA means microampere, an electrical unit. Instead, for example, only indexes referencing actual values of the magnitudes are stored in registers for each block, minimizing storage overhead. Likewise the stress threshold resistance can have pre-determined values (e.g. 100 kilo-ohm, 1 mega-ohm), such that actual resistance values do not need to be stored for each block. Instead, for example, only indexes referencing the actual resistance values are stored in registers for each block, minimizing storage overhead. A number of memory cells having resistance values lower or greater than the stress threshold resistance after program pulses having the stress threshold magnitude is applied, and/or a number of memory cells passing verify can be expressed in percentage or fraction, further minimizing storage overhead.

A row decoder 161 is coupled to a plurality of word lines 162 arranged along rows in the memory array 160. Logic to maintain statistics for blocks in the plurality of blocks (e.g. 170) is coupled to a set of page buffers 163, in this example via data bus 167. The global bit lines 164 are coupled to local bit lines (not shown) arranged along columns in the memory array 160. Addresses are supplied on bus 165 to the set of page buffers 163 and row decoder 161. Data is supplied via the data line 175 to/from other circuitry 180 on the memory circuit. In embodiments, the memory circuit can be a general purpose processor, a special purpose application circuitry, or a combination of modules providing system-on-a-chip functionality supported by the memory array 160. Data is supplied via the data line 175 to input/output ports 113 or to other data destinations internal or external to the memory circuit device 100.

The memory circuit 100 can include a control port 111, and an input/output port 113. The control port 111 includes circuits that receive control signals 112 in communication with external devices, including such control signals as chip enable signals, read enable signals, write enable signals, command enable signals, address enable signals, clock signals, etc. The input/output port 113 functions as the input port or the output port of the memory circuit 100, depending on values of the control signals 112 received at the control port 111. The input/output port 113 includes circuits that receive input signals and transmit output signals. The input signals may include command signals, address signals, and input data signals. The output signals may include the stress statistics and the program statistics stored in the registers 120, and accessible, for example, via signals 125 between the registers 120 and the input/output port 113.

The memory circuit 100 can include a command decoder 115 coupled to the control port 111 via signals 116 and coupled to the input/output port 113 via signals 117. The command decoder 115 can decode a command to execute the stress sequence from a source external to the memory circuit. The command can be received on the input/output port 113 from command/address/data signals 114. Alternatively, the controller 150 can perform the logic to execute the stress sequence in response to internal logic, instead of the command to execute the stress sequence from a source external to the memory circuit.

Figure 2:
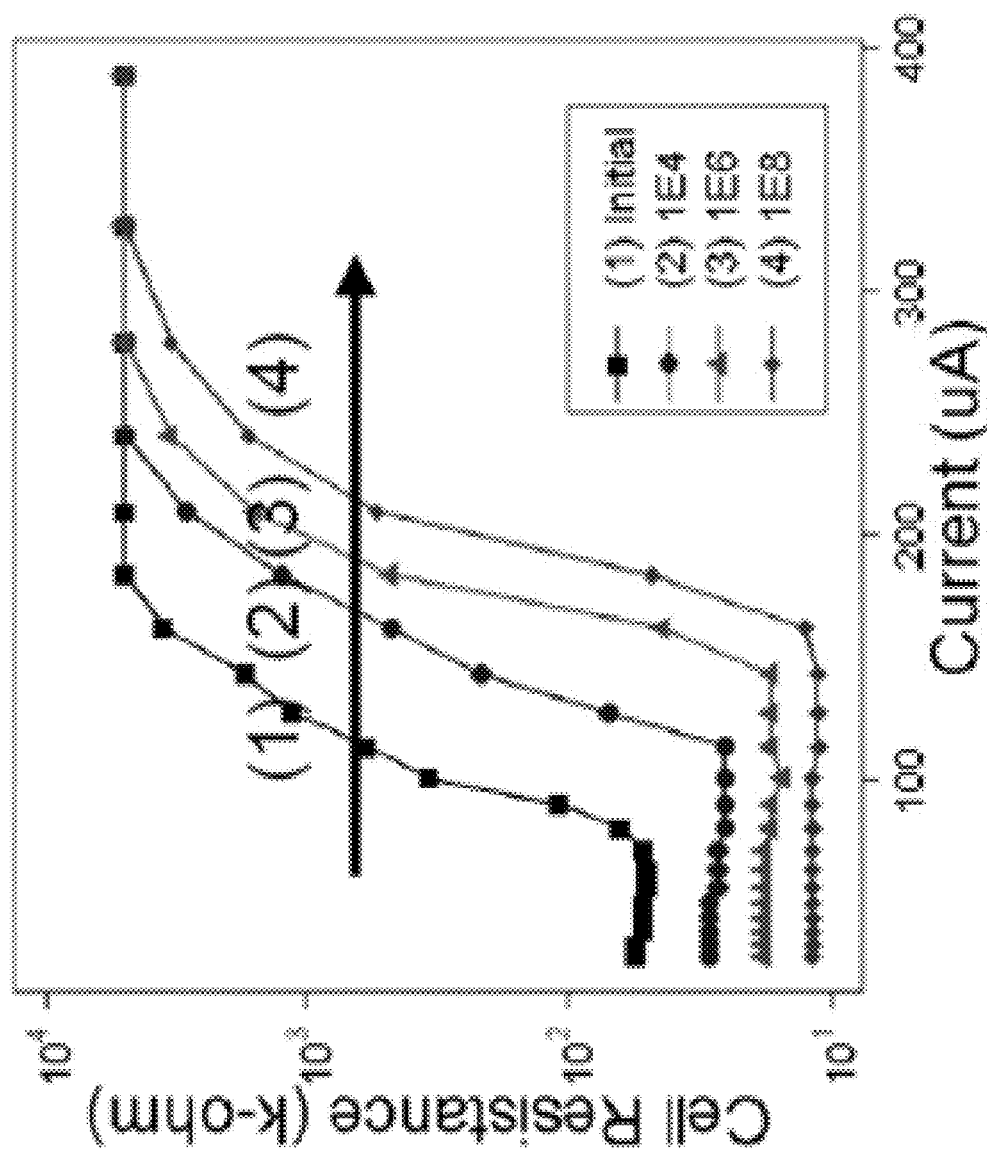
FIG. 2 illustrates R-I (resistance-current) curves of a PCM (phase change memory) cell undergoing cycling stress.

FIG. 2 illustrates R-I (resistance-current) curves of a PCM (phase change memory) cell undergoing cycling stress from an initial set state to a final reset state. Curve (1) shows an R-I curve before any cycling stress. Curve (2), (3) and (4) show R-I curves after 1E4, 1E6 and 1E8 program/erase cycles of stress, respectively. A right shift with increasing program pulse magnitudes (e.g. voltage magnitude, current magnitude, or power magnitude) can be seen in the partial-reset states between the initial set state and the final reset state, as indicated by the arrow. The right shift of R-I curves illustrates that after cycling stress, the PCM cell requires a program pulse having a higher magnitude (e.g. higher voltage magnitude, higher current magnitude, or higher power magnitude), not lower magnitude, to reach the final reset state. Resistance of the full-reset state stays constant when the PCM cell undergoes the cycling stress.

Figure 3:
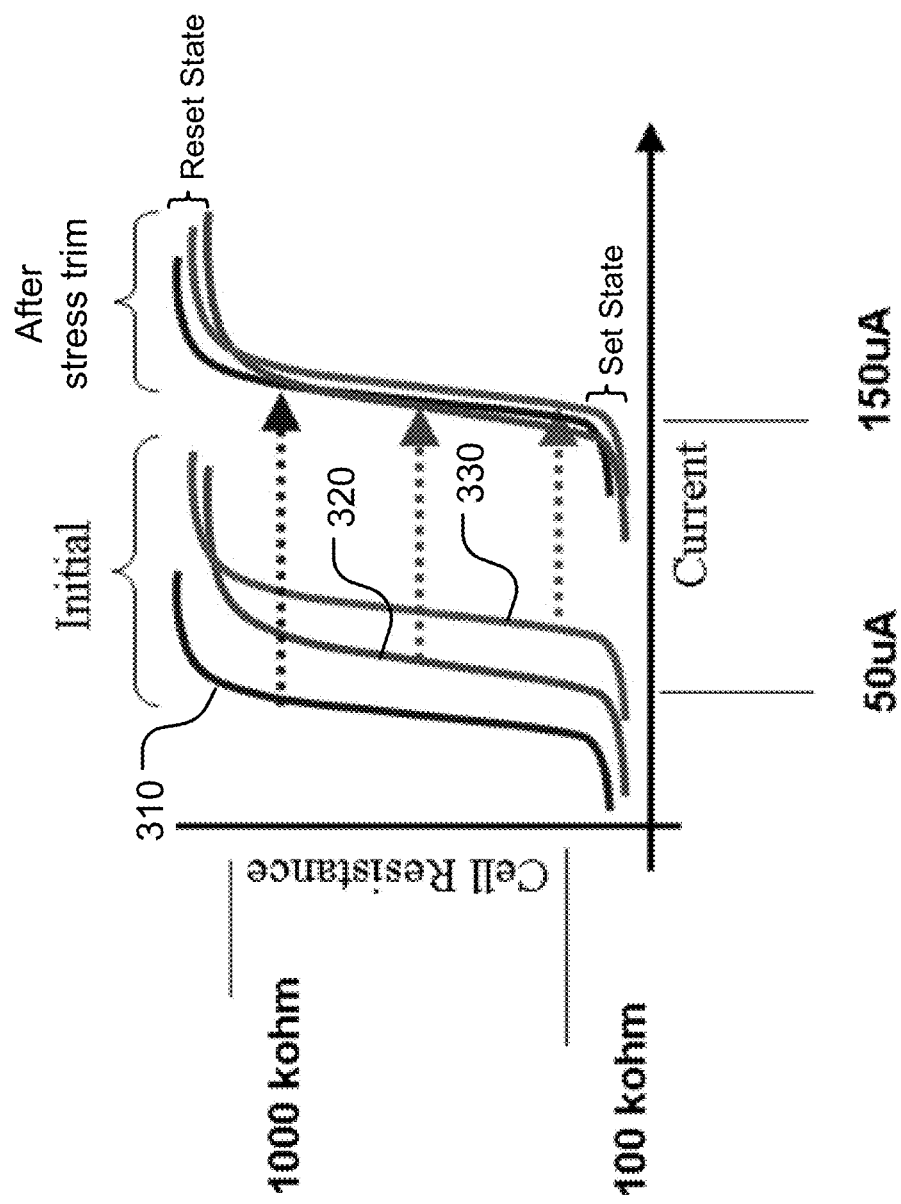
FIG. 3 illustrates R-I curves of multiple PCM cells undergoing cycling stress.

FIG. 3 illustrates R-I curves of multiple PCM (phase change memory) cells undergoing cycling stress from an initial set state (e.g. 100 kilo ohm) to a final reset state (e.g. 1000 kilo-ohm). Curves 310, 320 and 330 represent R-I curves of PCM cells that require lower, medium, and higher magnitudes of program pulses (e.g. below 50 uA, about 50 uA, and above 50 uA) to reach the final reset state. By applying different amounts of cycling stress on the memory cells, the R-I curves can be right-shifted to a narrower program magnitude range than an original program magnitude range of the R-I curves before cycling stress. For instance, a higher amount of cycling stress can be applied to a first PCM cell requiring a lower magnitude of a program pulse as shown by curve 310, a medium amount of cycling stress can be applied to a second PCM cell requiring a medium magnitude of a program pulse as shown by curve 320, and a lower amount of cycling stress can be applied to a third PCM cell requiring a higher magnitude of a program pulse as shown by curve 330.

Figure 4B:
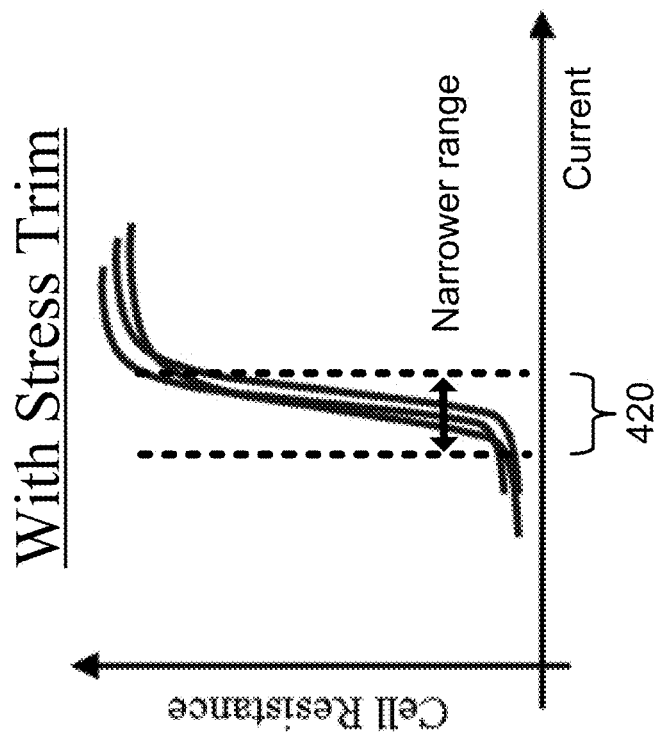
FIGS. 4A and 4B illustrate R-I curves of multiple PCM cells right shifted from a wider program magnitude range to a narrower program magnitude range, after a stress sequence is applied to the cells.
Figure 4A:
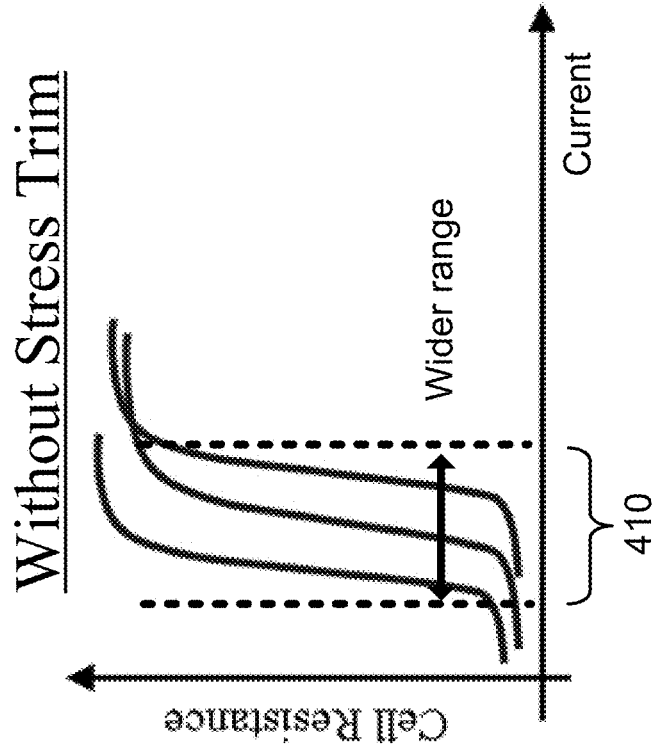

FIGS. 4A and 4B illustrate R-I curves of multiple PCM (phase change memory) cells right shifted from a wider program magnitude range to a narrower program magnitude range, after a stress sequence is executed to the cells. A program magnitude range can also be in voltage, or in power, although the program magnitude ranges in FIGS. 4A and 4B are shown in current. A program operation includes an iterative sequence of electrical pulses with verify operations to program a PCM cell. The number of electrical pulses required can vary between PCM cells, depending on magnitudes of program pulses required to program the PCM cells to target resistance values. During the life cycle of PCM cells, a range of program pulse magnitudes for PCM cells in a block of PCM cells can become wider, such that more iterative steps are required to program the PCM cells and degrade the performance of the program operation. By executing a stress sequence to the block of PCM cells as described herein, where the stress sequence includes multiple program/erase cycles (e.g. hundreds of program/erase cycles), a wider program magnitude range (e.g. 410, FIG. 4A) can be right shifted to a narrower program magnitude range (e.g. 420, FIG. 4B), such that fewer iterative steps are required to program the PCM cells and improve the performance of the program operation. Alternatively, a different programming sequence can be used to program the PCM cells, such as sequences that do not increment magnitudes of program pulses at each iterative step, or include steps that decrement magnitudes of program pulses in peak values.

In an ISPP sequence as shown in FIG. 6, an iterative sequence of program pulses with verify pulses is applied to a set of memory cells. If some of the memory cells in the set do not pass verify (e.g. not matching a target resistance value that represents a logic value), then the magnitude of the program pulses is incrementally increased, and program pulses having the increased magnitude with verify pulses are applied to memory cells in the set that do not pass verify.

In one implementation, stress pulses with the maximum magnitude available can be used in a stress sequence during stress trim operations, as stress pulses in a stress sequence with higher magnitudes can yield more efficient and more effective stress trim results. The memory circuit can include hardware circuitry to provide stress pulses having higher magnitudes than for program pulses used in normal set and reset operations such as in an ISPP sequence, and stress trim operations can use the stress pulses having the higher magnitudes for more efficient and more effective stress trimming. In an alternative embodiment, stress trim operations as described herein can use stress pulses that have magnitudes suitable for program pulses used in normal set and reset operations such as in an ISPP sequence, although such magnitudes for normal set and reset operations can be less efficient and less effective for stress trimming than the higher magnitudes. In embodiments, stress trim operations as described herein can use stress pulses that have constant magnitudes, or variable magnitudes including incrementally increased magnitudes and incrementally decreased magnitudes. Furthermore, magnitudes for stress pulses used in a stress sequence as described herein in embodiments can be combined with the waveforms as shown in FIGS. 16A, 16B, 16C and 16D.

In one implementation such as shown in the example of FIG. 9, multiple stress pulses in a stress sequence (e.g. hundreds of program/erase cycles) can be applied to a selected block of memory cells, without any verify pulses as in the ISPP sequence, and without verifying resistance of memory cells in the selected block against the target resistance value for each program pulse as in the ISPP sequence. As further described in connection with FIG. 9, after the multiple stress pulses in the stress sequence are applied to the memory cells, program pulses having the stress threshold magnitude are executed to the memory cells and resistance of memory cells in the selected block are verified against a threshold resistance. The stress sequence can be repeated on memory cells that do not pass verify based on the stress threshold magnitude and the threshold resistance, without any verify pulses as in the ISPP sequence, and without verifying resistance of memory cells in the selected block against the target resistance value for each program pulse as in the ISPP sequence. In an alternative implementation, verify pulses can be applied for respective stress pulses, although verify pulses can be ineffective and inefficient for stress trimming, as magnitudes of verify pulses are lower than magnitudes suitable for program pulses used in normal set and reset operations such as in an ISPP sequence, and consequently lower than higher magnitudes more effective and more efficient for stress trimming. Furthermore, pulse widths of verify pulses can be shorter than pulse widths suitable for program pulses used in normal set and reset operations such as in an ISPP sequence, and consequently shorter than longer pulse widths more effective and more efficient for stress trimming.

Figure 5:
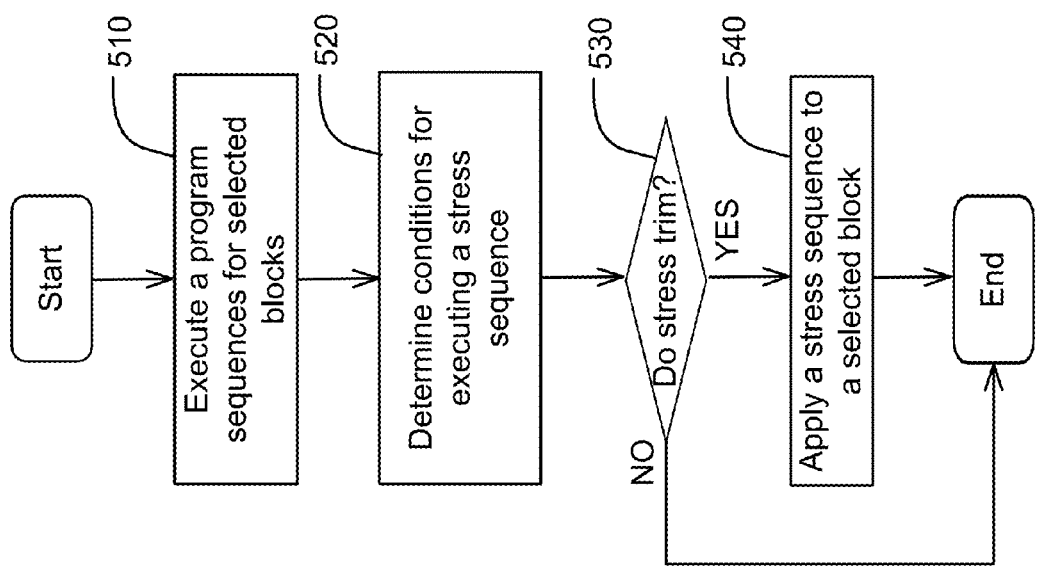
FIG. 5 is a simplified flowchart of an embodiment of a method for operating a memory circuit including a block of memory cells.

FIG. 5 is a simplified flowchart of an embodiment of a method for operating a memory circuit including a block of memory cells. At Step 510, program sequences are executed for selected blocks of memory cells, where the program sequences include a pattern of program/verify cycles. The program/verify cycles of the program sequences can include a program pulse which induces a change in resistance of the memory cell, and a verify step which detects whether the cell has a resistance passes a verify threshold (e.g. stress threshold resistance). In one implementation, the program sequence can include an incremental stepped pulse programming sequence (ISPP). An example of an ISPP sequence is described in connection with FIG. 6. An example of a modified ISPP sequence is described in connection with FIGS. 7 and 8, that includes steps in the ISPP sequence, and additional steps to determine conditions for executing a stress sequence.

A program sequence includes a sequence of program pulses in program/verify cycles in the program sequence, where the sequence of program pulses has a range from a lowest magnitude to a highest magnitude. Statistics resulting from executing program sequences can include, for each block in the selected blocks, a set of selected magnitudes in the range, and numbers indicating proportions of memory cells in the block that have resistance passing a verify threshold when program pulses having respective selected magnitudes in the set are applied to the memory cells.

At Steps 520 and 530, conditions can be determined for executing a stress sequence, based on the statistics resulting from Step 510. Examples of determining the conditions for executing a stress sequence are described in connection with FIGS. 10-13.

At Step 540, a stress sequence is executed to a selected block, where the stress sequence includes stress pulses configured to stress memory cells in the block that do not pass verify. The stress pulses can include program/erase cycles. An example of a stress sequence is described in connection with FIG. 9.

FIG. 6 is a simplified flowchart of an ISPP sequence. At Step 610, an iterative sequence of program pulses with verify pulses is applied to a set of memory cells, where the program pulses have a magnitude (e.g. in voltage, current or power). At Step 620, it is determined whether all cells in the set of memory cells pass verify. At Step 630, if some of the memory cells in the set do not pass verify (e.g. not matching a target resistance value), then the magnitude is incrementally increased, and memory cells in the set that pass verify are masked. At Step 610 in a next iteration, program pulses having the increased magnitude with verify pulses are applied to memory cells in the set that do not pass verify and therefore not masked in the last iteration. The ISPP sequence ends when all memory cells in the set pass verify.

FIG. 7 is a simplified flowchart for executing program sequences for selected blocks in a plurality of blocks, to program memory cells in the selected blocks and to gather statistics to determine conditions for executing a stress sequence for one of the selected blocks, using a modified ISPP sequence as an example. A memory cell is programmed to a logic value when the memory cell has resistance (Rcell) matching a target resistance (Rtarget) representing the logic value. The target resistance can include a range of resistance values, and the memory cell has resistance matching the target resistance if the resistance of the memory cell falls within the range of resistance values. For instance, a 2-bit MLC memory cell can have 4 resistance values corresponding to 4 logic values (e.g. 00, 01, 10, 11 for 2 bits), and the target resistance can correspond to one of the 4 resistance values. Each program/verify cycle in the program/verify cycles in a program sequence includes a first verify that verifies whether memory cells in a selected block in the selected blocks have resistance matching a target resistance representing a logic value.

For the purpose of gathering statistics to determine conditions for executing a stress sequence, a memory cell passes a second verify if the resistance of the memory cell (Rcell) matches a stress threshold resistance (Rth). The stress threshold resistance can be within a range of resistance values including the resistance values corresponding to the different logic values of the memory cell, and can be different from the target resistance (Rtarget). The stress threshold resistance (Rth) is further described in connection with FIG. 8. A program sequence includes a sequence of program pulses in program/verify cycles in the program sequence, where the sequence of program pulses has a range from a lowest magnitude to a highest magnitude. The statistics gathered can include, for each block in the plurality of blocks, a set of selected magnitudes in the range, and numbers indicating proportions of memory cells in the block that have resistance passing a verify threshold when program pulses having respective selected magnitudes in the set of selected magnitudes are applied to the memory cells.

A second verify in addition to the first verify in particular program/verify cycles in the program sequence that have a program magnitude matching a selected magnitude in the set of selected magnitudes can be applied to the memory cells in the selected block. Resistance of the memory cells in the selected block can then be compared against the verify threshold (e.g. stress threshold resistance) using the second verify, and the numbers can be updated with results of the comparison for the selected block, where the numbers are the numbers indicating proportions of memory cells in a selected block that have resistance passing the verify threshold when program pulses having respective selected magnitudes in the set of selected magnitudes are applied to the memory cells.

At Step 710, the stress statistics and the program statistics are read from the registers or OOB areas in the memory circuit. The stress statistics and the program statistics are described in connection with FIG. 1. At Step 720, an iterative sequence of program pulses having a magnitude (e.g. in voltage, current, power) is applied to a set of memory cells with verify pulses.

At Step 730, it is determined whether the magnitude of the program pulses matches a magnitude in a set of magnitudes. If yes, then at Step 740, a second verify in a program/verify cycle that has a program magnitude matching a selected magnitude in the set of selected magnitudes is applied to the memory cells. The second verify is in addition to the first verify applied for verifying resistance of the memory cells when program pulses are applied to the memory cells at Step 720. Resistance of memory cells in the selected block can then be compared against the verify threshold (e.g. stress threshold resistance) using the second verify. In one implementation, a number of cells that pass the second verify can be summed, while in an alternative implementation, a number of cells that do not pass the second verify can be summed. Numbers indicating proportions of memory cells in the block that have resistance passing a verify threshold when program pulses having respective selected magnitudes in the set are applied to the memory cells can be updated with the summed number of cells that pass the second verify or do not pass the second verify. At Step 745, the program statistics, including numbers indicating proportions of memory cells in the block that have resistance passing a verify threshold when program pulses having respective selected magnitudes in the set are applied to the memory cells, is stored in the registers or OOBs. The number of cells that pass the second verify or the number of cells that do not pass the second verify can be used for determining conditions for executing a stress sequence.

At Step 750, it is determined whether cell resistance of the memory cells match the ISPP target resistance. If yes, then at Step 760, memory cells with resistance matching the ISPP target resistance is logically masked so they will not be processed during the next iteration. At Step 770, if all memory cells in the set of memory cells have been masked, then the modified ISPP sequence ends. If not, the magnitude of the program pulses is incrementally increased at Step 780, and a next iteration starts for memory cells that have not matched the ISPP target resistance.

In one implementation, the stress threshold magnitude indicates the minimum turn-on magnitude of the PCM memory cells, and therefore any program pulses having magnitudes less than the stress threshold magnitude can be skipped in modified ISPP operations. Thus the number of programming steps can be reduced, compared to conventional ISPP operations.

In one implementation, modified ISPP sequences can be used instead of the ISPP sequences, such as described in connection with FIG. 6, for programming memory cells, such that the statistics stored in the registers is up-to-date for stress sequences. In an alternative implementation, the ISPP sequences are used for programming memory cells, while modified ISPP sequences are executed periodically in program/erase cycle count (e.g. 1,000 or 10,000 cycles). Because the R-I curve shifting is gradual, it can be sufficient to perform modified ISPP sequences periodically.

FIG. 8 is a graph showing example program and verify pulses in a modified ISPP sequence. FIG. 8 shows four program pulses (e.g. P1, P2, P3 and P4) with respective verify pulses (e.g. V1, V2, V3 and V4) applied to a memory cell. The modified ISPP sequence stops when the memory cell passes verify, for example when Rcell matches Rtarget as determined with the verify pulse V4. If the memory cell fails verify, then the modified ISPP sequence continues to a next program/verify cycle in the illustrated sequence. In the example, the memory cell fails verify as determined with verify pulses V1, V2 and V3, so program pulses P2, P3 and P4 are applied, respectively.

Each program/verify cycle in the patterns of program/verify cycles in a program sequence includes a first verify that verifies whether memory cells in a selected block in the selected blocks have resistance matching a target resistance representing a logic value. In the modified ISPP sequence, a second verify (e.g. AV3, AV4) can be applied to memory cells in the selected block, in particular program/verify cycles in the program sequence that have a program magnitude matching a selected magnitude in a set of selected magnitudes. A second verify and a first verify can be applied between two program pulses. The second verify (e.g. AV3) can be applied before the verify pulse (e.g. V3) so that the modified ISPP sequence will not end before the second verify is applied.

In one implementation, a number of cells that pass verify can be summed, while in an alternative implementation, a number of cells that do not pass verify can be summed. The number of cells that pass verify or the number of cells that do not pass verify can be stored in the registers or OOBs in the memory circuits, for use in executing the stress sequence as described herein.

In reference to the modified ISPP sequence shown in FIG. 8, if the stress threshold resistance (e.g. 1 mega-ohm) is greater than the target resistance for programming the memory cell (e.g. 100 kilo-ohm), then the modified ISPP sequence may stop once the target resistance is matched, and consequently the stress threshold resistance of 1 mega-ohm will not be used in the program sequence, and the program statistics will not be updated with the condition of the memory cell.

Accordingly, for stress trim operations to reset memory cells into an amorphous phase, starting at a set state, it is preferable to have the stress threshold resistance match the resistance value of the first non-set state (e.g. 100 kilo-ohm). The resistance value of the first non-set state is a resistance value corresponding to a logic value of the MLC memory cell and is the closest to the resistance of the set state as compared to other resistance values corresponding to other logic values of the MLC memory cell.

Likewise, for stress trim operations to set memory cells into a crystalline phase, starting at a reset state, it is preferable to have the stress threshold resistance match the resistance value of the first non-reset state (e.g. 1 mega-ohm). The resistance value of the first non-reset state is a resistance value corresponding to a logic value of the MLC memory cell and is the closest to the resistance of the reset state as compared to other resistance values corresponding to other logic values of the MLC memory cell.

Figure 8A:
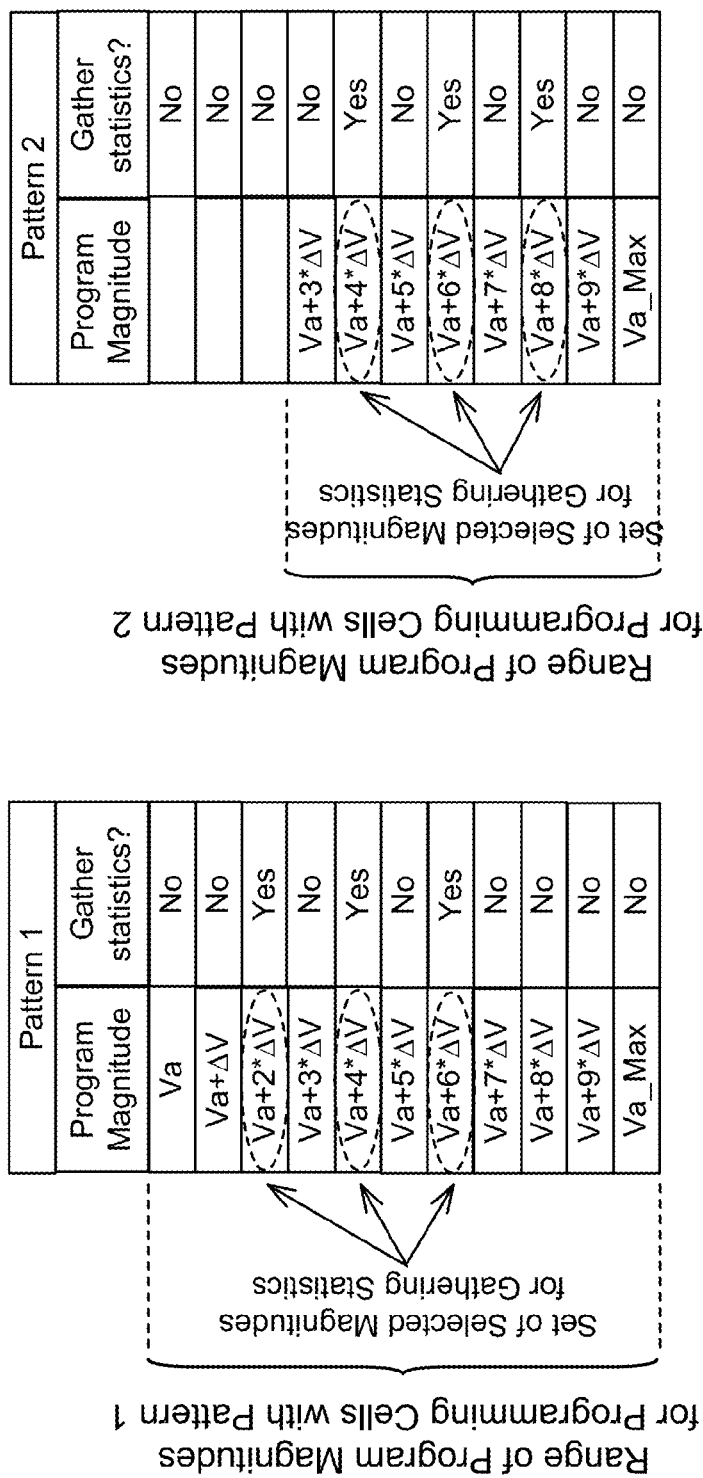
FIG. 8A illustrates different patterns for the program/verify cycles on a block by block basis that the controller can assign, and statistics gathering steps within the different patterns.

FIG. 8A illustrates different patterns for the program/verify cycles on a block by block basis that the controller can assign, and statistics gathering steps within the different patterns.

A first program sequence including a first pattern (e.g. Pattern 1) of program/verify cycles is executed, including a sequence of program pulses in program/verify cycles in the program sequence, where the sequence of program pulses has a range of program magnitudes from a lowest magnitude (e.g. a starting voltage level Va) to a highest magnitude (e.g. an ending voltage level Va_Max). The first program sequence is applied to a memory cell to induce a change in resistance of the memory cell, so that the resistance of the memory cell can match a target resistance representing a logic value, as verified by verify pulses applied in the program/verify cycles in the program sequence. For instance, a 2-bit MLC memory cell can have 4 resistance values representing 4 logic values (e.g. 00, 01, 10, 11 for 2 bits), and the target resistance can correspond to one of the 4 resistance values. The step for each program pulse is a constant $\Delta V$ in this example. The number of program pulses for the first pattern (e.g. Pattern 1) pass can be determined by the difference between Va_Max and Va, divided by the size of the step $\Delta V$, plus an additional cycle.

Program magnitudes (e.g. Va+$\Delta V$, Va+2*$\Delta V$, . . . Va+9*$\Delta V$) shown in FIG. 8A are for example only. In embodiments, there can be more or fewer program magnitudes in a program sequence including a pattern of program/verify cycles, and the step for each program pulse in the program/verify cycles in the pattern can be variable instead of a constant $\Delta V$. Although the program magnitude is in voltage in this example, the program magnitude can also be in current or in power.

The program sequence includes verify pulses for respective program pulses in the pattern of program/verify cycles. The program sequence stops when the memory cell passes verify against a target resistance, for example when resistance of the memory cell matches the target resistance as determined with the verify pulse. If the memory cell fails verify, then the program sequence continues to a next program/verify cycle in the pattern of program/verify cycles in the program sequence.

While the first program sequence including the first pattern of program/verify cycles is executed using the first pattern (e.g. Pattern 1), statistics can be gathered when program pulses having a magnitude matching a selected magnitude (e.g. Va+2*$\Delta V$) in a set of selected magnitudes (e.g. Va+2*$\Delta V$, Va+4*$\Delta V$, Va+6*$\Delta V$) are applied to the memory cell. There can be multiple program pulses between two adjacent selected magnitudes in the set of selected magnitudes, where the multiple program pulses between two adjacent selected magnitudes have multiple program magnitudes including multiple steps (e.g. $\Delta V$'s). In one embodiment, an interval in magnitude between two adjacent selected magnitudes can be constant (e.g. 25 uA). In an alternative embodiment, intervals in magnitude between two adjacent selected magnitudes can be variable. In one implementation, when program pulses having a magnitude matching a selected magnitude are applied to the memory cell in a block of memory cells, a second verify is applied to verify the resistance of the memory cell against a stress threshold resistance. The second verify in a program/verify cycle in the program sequence is in addition to a first verify in the program/verify cycle that verifies whether memory cells in a selected block match a target resistance representing a logic value. The stress threshold resistance is further described in connection with FIG. 8.

A number of memory cells can be summed that have resistance passing a verify threshold (e.g. resistance of the memory cell less than the stress threshold resistance) when program pulses having a selected magnitude in the set of selected magnitudes are applied to the memory cells. The statistics gathered can include, for each block in the plurality of blocks, a set of selected magnitudes from the range of program magnitudes of the program/verify sequence, and numbers indicating proportions of memory cells in the block that have resistance passing a verify threshold when program pulses having respective selected magnitudes in the set are applied to the memory cells. The proportions of memory cells can be derived from numbers of memory cells that have resistance passing the verify threshold when program pulses having respective selected magnitudes in the set of selected magnitudes are applied to the memory cells.

A stress threshold magnitude for use in subsequent stress operations can then be determined from the set of selected magnitudes, based on proportions of memory cells in the block that have resistance less than the stress threshold resistance when program pulses having respective selected magnitudes in the set are applied to the memory cells. In one example, at the selected magnitude of (Va+2*ΔV), 100% of the memory cells in the block have resistance less than the stress threshold resistance and therefore pass verify. At the selected magnitude of (Va+4*ΔV), 80% of the memory cells in the block have resistance less than the stress threshold resistance and therefore pass verify, while 20% of the memory cells have resistance greater the stress threshold resistance and therefore do not pass verify. At the selected magnitude of (Va+6*ΔV), 20% of the memory cells in the block have resistance less than the stress threshold resistance and therefore pass verify, while 80% of the memory cells have resistance greater than the stress threshold resistance and therefore do not pass verify.

The stress threshold magnitude can be determined such that a first proportion of memory cells in the block that have resistance passing a verify threshold when program pulses having the stress threshold magnitude are applied to the memory cells is greater than a second proportion of memory cells that have resistance not passing the verify threshold when program pulses having the stress threshold magnitude are applied to the memory cells. Based on the statistics gathered, at the selected magnitude of (Va+4*ΔV), a majority (e.g. 80%) of the memory cells have resistance less than the stress threshold resistance, and therefore and therefore pass verify. Accordingly, the stress threshold magnitude can be determined to be (Va+4*ΔV), such that only a minority of memory cells need to be stressed to narrow the range of program magnitudes for programming memory cells in the block.

Subsequently, a stress trim operation using the determined stress threshold magnitude can be applied on the minority (e.g. 20%) of the memory cells previously having resistance greater than the stress threshold resistance at the program magnitude of (Va+4*ΔV), resulting in those 20% memory cells now having resistance less than the stress threshold resistance at (Va+4*ΔV). Consequently 100% of the memory cells can have resistance less than the stress threshold resistance at the stress threshold magnitude of (Va+4*ΔV), resulting in reduced cell-to-cell variations of PCM cells.

After the stress trim operation, a second program sequence including a second pattern (e.g. Pattern 2) of program/verify cycles is executed. Because the stress trim operation has resulted in 100% of the memory cells having resistance less than the stress threshold resistance at the stress threshold magnitude of (Va+4*ΔV), the lowest magnitude for Pattern 2 can be increased from (Va) in the first pattern (e.g. Pattern 1) to a magnitude (e.g. Va+3*ΔV) lower than or equal to the stress threshold magnitude (e.g. Va+4*ΔV) in the second pattern (e.g. Pattern 2). The stress threshold magnitude can indicate the minimum turn-on magnitude of the memory cells, and therefore any program pulses having magnitudes less than the stress threshold magnitude can be skipped to reduce the number of programming steps.

With the stress threshold magnitude determined to be (Va+4*ΔV), the selected magnitude having a lowest value (e.g. Va+2*ΔV) is no longer effective, because it now yields 100% passing. Accordingly the statistics is updated to remove the selected magnitude having a lowest value value (e.g. Va+2*ΔV) from the set of selected magnitudes and to add a new selected magnitude (e.g. Va+8*ΔV) having a value higher than a highest selected magnitude (e.g. Va+6*ΔV) in Pattern 1 to the set of selected magnitudes.

Consequently, while the second program sequence including the second pattern of program/verify cycles is executed using the second pattern (e.g. Pattern 2), statistics can be gathered when program pulses having a magnitude matching a selected magnitude (e.g. Va+4*ΔV) in an updated set of selected magnitudes (e.g. Va+4*ΔV, Va+6*ΔV, Va+8*ΔV) are applied to the memory cell.

FIG. 9 is a simplified flowchart of a stress sequence. The stress sequence can include stress pulses configured to stress memory cells in a block of memory cells that do not pass verify, where the stress pulses can include multiple program/erase cycles such as hundreds of program/erase cycles (Step 910). In one implementation, memory cells do not pass verify if the memory cells have resistance values (Rcell) greater than the stress threshold resistance (Rth) when program pulses having a stress threshold magnitude are applied to the memory cells. The stress threshold magnitude can be in voltage, current or power.

At Step 920, after the stress pulses are applied to the memory cells in the block that do not pass verify, program pulses having the stress threshold magnitude and verify pulses are executed to those memory cells. In one implementation, memory cells pass verify if the memory cells have resistance values (Rcell) less than the stress threshold resistance (Rth) after the program pulses having the stress threshold magnitude are applied to the memory cells. At Step 930, if a memory cell has cell resistance (Rcell) less than the stress threshold resistance (Rth) and therefore passes verify, then the memory cell is logically masked out for the next iteration. A logical mask is maintained indicating verify results of Step 920. Any memory cells that still have cell resistance greater than the stress threshold resistance after the stress threshold pulses are applied are not masked out. Stress pulses can be applied to memory cells in the block that have resistance not passing verify as indicated by the logical mask (Step 940). The stress sequence can repeat in multiple iterations until a limitation for executing the stress sequence on the block of memory cells has been reached (Step 950). The limitation can include a time limit such as 100 ms, a loop iteration limit such as 100, and a stress cycle count such as $10^6$.

If a command to perform a stress sequence is received on a particular block or page, and no program sequence (e.g. modified ISPP sequence) has been performed on the particular block or page, then it is not necessary to perform stress trim operations on the particular block or page. This condition can be determined by checking the program statistics. If the number of memory cells passing verify is zero or 0% for all corresponding selected magnitudes in program pulses, then it is not necessary to perform a stress sequence on the particular block or page.

The stress statistics and the program statistics can be initialized for one or more blocks of phase change memory cells with initial values stored in registers or OOB areas in the PCM chip or off-chip. Initially the stress statistics and the program statistics can be determined from in-factory statistical measurements from one or more PCM chips. The in-factory statistical measurements can be applied to more PCM chips than the PCM chips from which the statistical measurements are taken. For instance, the in-factory statistical measurements from one or more PCM chips on one or more semiconductor wafers can be applied to all chips on the same wafer or on a batch of wafers.

Examples are provided below to show how the program sequence and the stress sequence are executed using the program statistics and the stress statistics. The in-factory statistical measurements can include statistics about resistance of memory cells after program pulses including magnitudes in a set of selected magnitudes (e.g. 150 uA, 175 uA and 200 uA) are applied to the memory cells. For example, the statistical measurements may show that a majority of the measured PCM cells (e.g. 90%) has cell resistance less than the stress threshold resistance (e.g. 100 kilo-ohms) when program pulses having a particular magnitude (e.g. 150 uA) in the set of selected magnitudes are applied to the memory cells. In other words, 90% of the measured memory cells have resistance below the stress threshold resistance after program pulses having the particular magnitude in the set of selected magnitudes are applied to the memory cells. Accordingly, the stress statistics may include initial values:

stress passing criterion=100%
stress threshold magnitude=150 uA
stress threshold resistance=100 kilo-ohms.

where the stress threshold magnitude is set to the particular magnitude in the set of selected magnitudes, and the stress passing criterion indicates the percentage of memory cells in the block that have cell resistance less than the stress threshold resistance when the memory cells are partially programmed with program pulses having the particular magnitude (e.g. 150 uA) in the set of selected magnitudes during a subsequent execution of a stress sequence.

A stress trim operation is then performed on a block of PCM cells until 100% of the cells has cell resistance less than the stress threshold resistance (e.g. 100 kilo-ohms) when program pulses having the particular magnitude (e.g. 150 uA) in the set of selected magnitudes are applied to the memory cells, in other words, until 100% of the measured memory cells have cell resistance below the stress threshold resistance after program pulses having the particular magnitude (e.g. 150 uA) in the set of selected magnitudes are applied to the memory cells. This can be accomplished by first applying stress pulses as described herein, such as hundreds of stress pulses, to memory cells in the block, subsequently applying program pulses having the particular magnitude (e.g. 150 uA) in the set of selected magnitudes to the memory cells, and then comparing resistance of the memory cells against the stress threshold resistance (e.g. 100 kilo-ohms).

As stress pulses in a stress sequence with higher magnitudes can yield more effective stress trim results, stress pulses with the maximum magnitude available can be used during stress trim operations. In one embodiment, stress trim operations as described herein can use program pulses having magnitudes suitable for normal set and reset operations as stress pulses on memory cells. In an alternative embodiment, the memory circuit can include hardware circuitry to provide stress pulses having higher magnitudes than program pulses for normal set and reset operations, and stress trim operations can use the stress pulses having the higher magnitudes for more efficient stress trimming.

Using the example above, the program statistics for a block of memory cells may include initial values:

selected magnitudes=150 uA, 175 uA, and 200 uA
percentage of memory cells passing=0%, 0%, and 0% where the percentage of memory cells passing verify at magnitudes in the set of selected magnitudes is 0%, indicating no program sequence has been performed since the in-factory statistical measurements.

Figure 10:
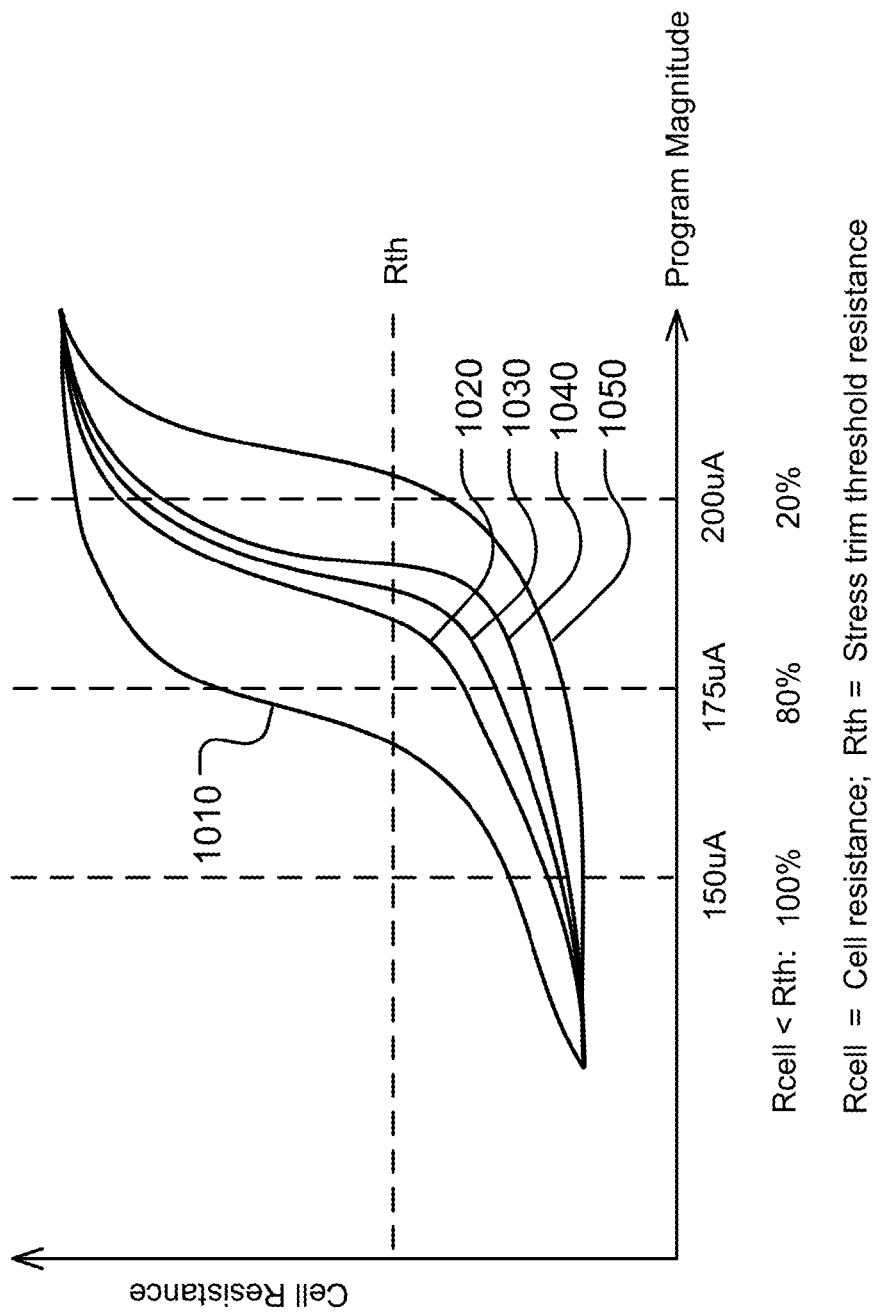
FIG. 10 illustrates R-I curves of memory cells, and indicates percentage of memory cells that pass verify when program pulses having respective selected magnitudes are applied to the memory cells, before a stress operation in a first example.

FIG. 10 illustrates R-I curves of memory cells, and indicates percentage of memory cells that pass verify when program pulses having respective selected magnitudes are applied to the memory cells, before a stress operation is executed, in a first example. After a certain number of program/erase cycles (e.g. 1,000 or 10,000), a program sequence, such as described in connection with FIG. 7, can be executed to the block of memory cells. As illustrated in FIG. 10, results of executing the program sequence may determine that the number of cells with cell resistance less than the stress threshold resistance (e.g. 100 kilo-ohms) after applied program pulses having magnitudes in the set of selected magnitudes (e.g. 150 uA, 175 uA and 200 uA) to be 100%, 80% and 20%, respectively. Accordingly, the program statistics is updated:

selected magnitudes=150 uA, 175 uA, and 200 uA
percentage of memory cells passing=100%, 80%, and 20%

As illustrated in FIG. 10, five curves (e.g. 1010, 1020, 1030, 1040 and 1050) represent 100% of memory cells in a block of memory cells. At the selected magnitude of 150 uA, 100% of the memory cells in the block have resistance below the stress threshold resistance and therefore pass verify. At the selected magnitude of 175 uA, 80% of the memory cells in the block, as represented by curves 1020, 1030, 1040 and 1050, have resistance below the stress threshold resistance and therefore pass verify, while 20% of the memory cells, as represented by the curve 1010, have resistance above the stress threshold resistance and therefore do not pass verify. At the selected magnitude of 200 uA, 20% of the memory cells in the block, as represented by curves 1050, have resistance below the stress threshold resistance and therefore pass verify, while 80% of the memory cells, as represented by curves 1010, 1020, 1030 and 1040, have resistance above the stress threshold resistance and therefore do not pass verify.

If the memory circuit including the block of memory cells receives a command to execute the stress sequence, such as described in connection with FIG. 9, the memory circuit can first read the updated program statistics. Based on the program statistics that, at the selected magnitude of 175 uA, a majority (e.g. 80%) of the memory cells have resistance below the stress threshold resistance, and therefore match the stress threshold resistance at program pulse magnitudes higher than the selected magnitude of 175 uA, the stress statistics can be updated:

stress passing criterion=100%
stress threshold magnitude=175 uA
stress threshold resistance=100 kilo-ohms where the stress threshold magnitude is updated from 150 uA to 175 uA.

Subsequently, stress trim operations using the updated stress statistics can be applied on the minority (e.g. 20%) of the memory cells previously having resistance greater than the stress threshold resistance of 100 kilo-ohms at 175 uA, resulting in those 20% memory cells now having resistance less than the stress threshold resistance at 175 uA. Consequently 100% of the memory cells can have resistance less than the stress threshold resistance at the stress threshold magnitude of 175 uA, resulting in reduced cell-to-cell variations of PCM cells, as shown in FIG. 11.

Figure 11:
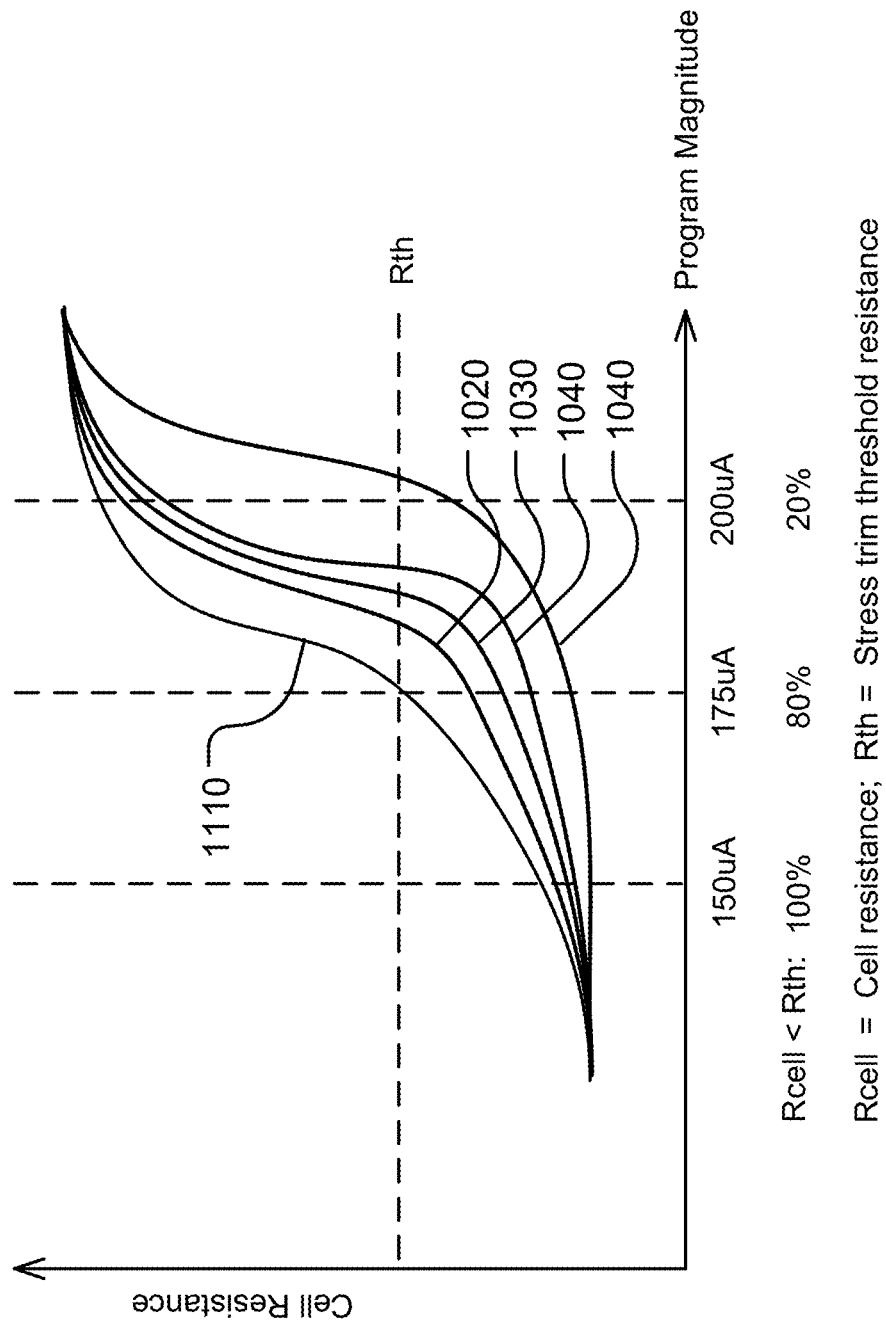
FIG. 11 illustrates R-I curves of memory cells, and indicates percentage of memory cells that pass verify when program pulses having respective selected magnitudes are applied to the memory cells, after a stress operation in the first example.

FIG. 11 illustrates R-I curves of memory cells, and indicates percentage of memory cells that pass verify when program pulses having respective selected magnitudes are applied to the memory cells, after a stress operation is executed, in the first example. Curves (e.g. 1020, 1030, 1040 and 1050) are as shown in FIG. 10, representing 80% of the memory cells in the block that, at the selected magnitude of 175 uA, have resistance below the stress threshold resistance and therefore pass verify. Curve 1110 represents the other 20% of memory cells that now also have resistance less than the stress threshold resistance at the stress threshold magnitude of 175 uA. Consequently, 100% of the memory cells now pass verify at the stress threshold magnitude of 175 uA.

With the stress threshold magnitude updated to 175 uA, the previously defined selected magnitude of 150 uA is no longer effective, because it now yields 100% passing. Accordingly the program statistics is updated:

selected magnitudes=175 uA, 200 uA and 225 uA percentage of memory cells passing=0%, 0%, and 0% where the previous selected magnitude of 150 uA is removed from the set of selected magnitudes and a program selected magnitude of 225 uA is added to the set of selected magnitudes.

Selected magnitudes in the set of selected magnitudes are now greater than or equal to the updated stress threshold magnitude of 175 uA. The percentage of memory cells passing verify at the multiple selected magnitudes is 0% because no program sequence has been executed since the selected magnitudes are updated, and the previous values for the percentage of memory cells passing has become invalid for the updated selected magnitudes.

After more program/erase cycles, the stress threshold magnitude may increase again, and another trim operation may be executed with the stress threshold magnitude updated to 200 uA from 175 uA. Trim operations can only increase the stress threshold magnitude, as described in connection with FIG. 2.

Figure 12:
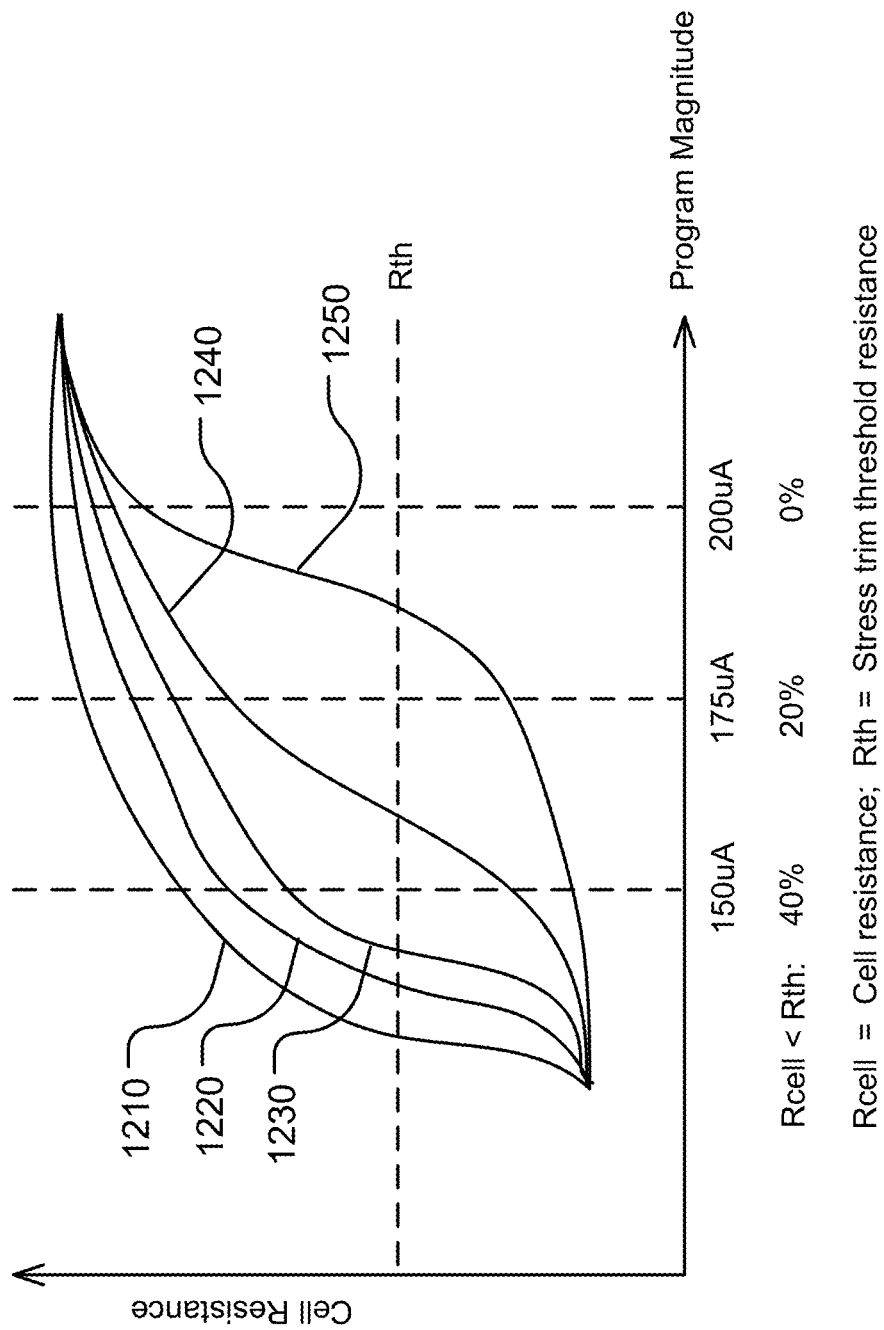
FIG. 12 illustrates R-I curves of memory cells, and indicates percentage of memory cells that pass verify when program pulses having respective selected magnitudes are applied to the memory cells, in a second example.

FIG. 12 illustrates R-I curves of memory cells, and indicates percentage of memory cells that pass verify when program pulses having respective selected magnitudes are applied to the memory cells, in a second example. After a certain number of program/erase cycles (e.g. 1,000 or 10,000), a program sequence, such as described in connection with FIG. 7, can be executed to the block of memory cells. As illustrated in the second example, results of executing the program sequence may determine that the number of cells with cell resistance less than the stress threshold resistance (e.g. 100 kilo-ohms) after applied program pulses having magnitudes in the set of selected magnitudes (e.g. 150 uA, 175 uA and 200 uA) to be 40%, 20% and 0%, respectively. Accordingly, the program statistics is updated:

selected magnitudes=150 uA, 175 uA, and 200 uA percentage of memory cells passing=40%, 20%, and 0%

As illustrated in FIG. 12, five curves (e.g. 1210, 1220, 1230, 1240 and 1250) represent 100% of memory cells in a block of memory cells. At the selected magnitude of 150 uA, 40% of the memory cells in the block, as represented by curves 1240 and 1250, have resistance below the stress threshold resistance and therefore pass verify, while 60% of the memory cells, as represented by curves 1210, 1220 and 1230, have resistance above the stress threshold resistance, and therefore do not pass verify. At the selected magnitude of 175 uA, 20% of the memory cells in the block, as represented by the curve 1250, have resistance below the stress threshold resistance and therefore pass verify, while 80% of the memory cells, as represented by curves 1210, 1220, 1230 and 1240 have resistance above the stress threshold resistance and therefore do not pass verify. At the selected magnitude of 200 uA, 100% of the memory cells in the block, as represented by curves 1210, 1220, 1230, 1240 and 1250, have resistance above the stress threshold resistance, and therefore do not pass verify.

If the memory circuit including the block of memory cells receives a command to execute the stress sequence, such as described in connection with FIG. 9, the memory circuit can first read the updated program statistics. Based on the program statistics that, at the selected magnitude of 175 uA, a minority (e.g. 20%) of the memory cells have resistance below the stress threshold resistance. In other words, the stress sequence needs to be executed to a majority of memory cells to narrow the range of program pulse magnitudes, because stress trim operations can only increase the stress threshold magnitude, as described in connection with FIG. 2. Accordingly, no stress trim operation is performed in this case.

Figure 13:
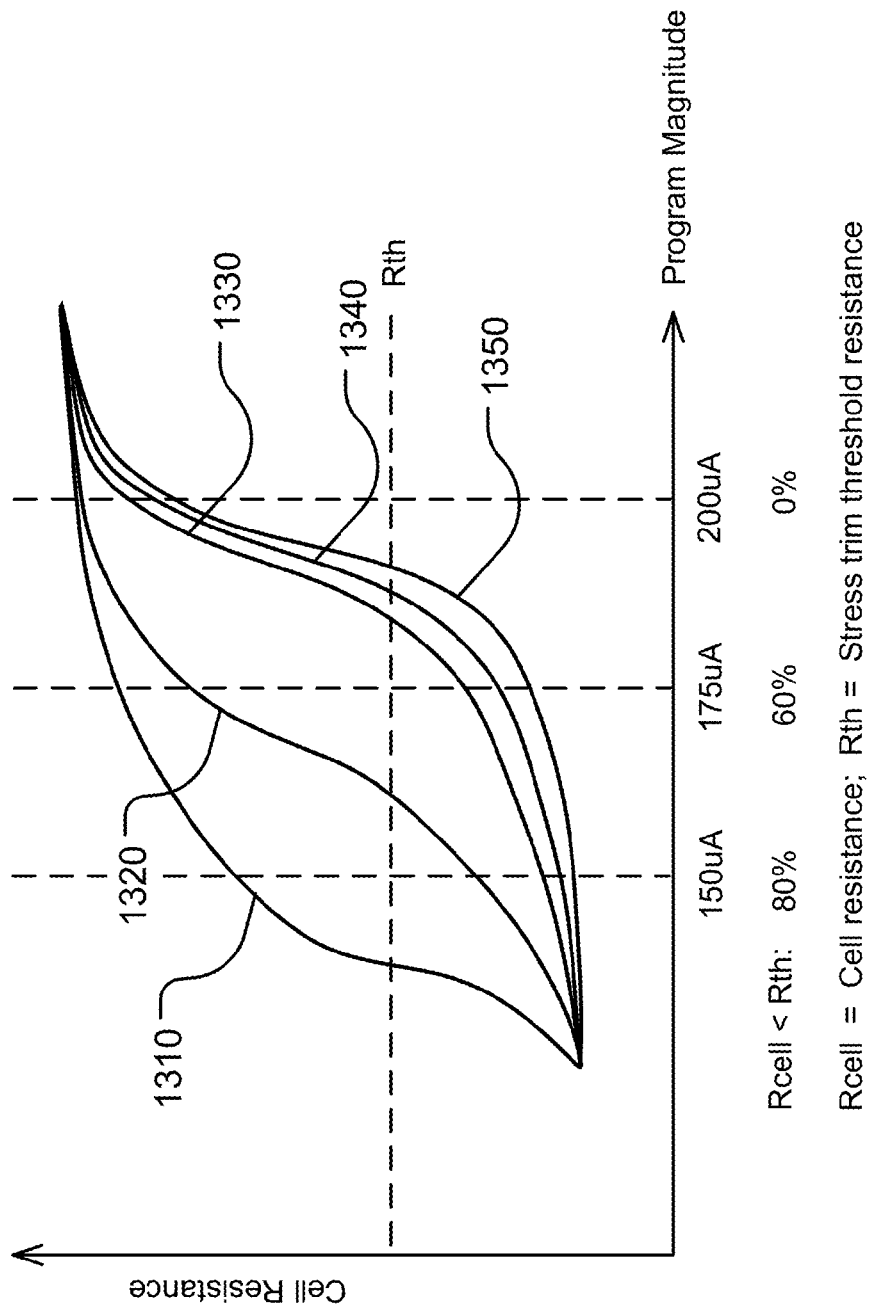
FIG. 13 illustrates R-I curves of memory cells, and indicates percentage of memory cells that pass verify when program pulses having respective selected magnitudes are applied to the memory cells, in a third example.

FIG. 13 illustrates R-I curves of memory cells, and indicates percentage of memory cells that pass verify when program pulses having respective selected magnitudes are applied to the memory cells, in a third example. After a certain number of program/erase cycles (e.g. 1,000 or 10,000), a program sequence, such as described in connection with FIG. 7, can be executed to the block of memory cells. As illustrated in the third example, results of executing the program sequence may determine that the number of cells with cell resistance less than the stress threshold resistance (e.g. 100 kilo-ohms) after applied program pulses having magnitudes in the set of selected magnitudes (e.g. 150 uA, 175 uA and 200 uA) to be 80%, 60% and 0%, respectively. Accordingly, the program statistics is updated:

selected magnitudes=150 uA, 175 uA, and 200 uA percentage of memory cells passing=80%, 60%, and 0%

As illustrated in FIG. 13, five curves (e.g. 1310, 1320, 1330, 1340 and 1350) represent 100% of memory cells in a block of memory cells. At the selected magnitude of 150 uA, 80% of the memory cells in the block, as represented by curves 1320, 1330, 1340 and 1350, have resistance below the stress threshold resistance and therefore pass verify, while 20% of the memory cells, as represented by the curve 1310, have resistance above the stress threshold resistance and therefore do not pass verify. At the selected magnitude of 175 uA, 60% of the memory cells in the block, as represented by the curves 1330, 1340 and 1350, have resistance below the stress threshold resistance and therefore pass verify, while 40% of the memory cells, as represented by curves 1310 and 1320 have resistance above the stress threshold resistance and therefore do not pass verify. At the selected magnitude of 200 uA, 100% of the memory cells in the block, as represented by curves 1310, 1320, 1330, 1340 and 1350, have resistance above the stress threshold resistance and therefore do not pass verify.

If the memory circuit including the block of memory cells receives a command to execute the stress sequence, such as described in connection with FIG. 9, the memory circuit can first read the updated program statistics. Based on the program statistics, at the selected magnitude of 150 uA, 80% of the memory cells have resistance below the stress threshold resistance, and at the selected magnitude of 175 uA, 60% of the memory cells have resistance below the stress threshold resistance. Accordingly, the stress statistics can be updated:

stress passing criterion=100% stress threshold magnitude=200 uA stress threshold resistance=100 kilo-ohms where the stress threshold magnitude is updated from 150 uA to 200 uA.

Subsequently, stress trim operations using the updated stress statistics can be applied on 20% of memory cells previously having resistance greater than the stress threshold resistance of 100 kilo-ohms at 150 uA, and on 40% of memory cells previously having resistance greater than the stress threshold resistance of 100 kilo-ohms at 175 uA resulting in those memory cells now having resistance less than the stress threshold resistance at 200 uA. Consequently 100% of the memory cells can have resistance less than the stress threshold resistance at the stress threshold magnitude of 200 uA, resulting in reduced cell-to-cell variations of PCM cells.

FIGS. 14A and 14B illustrate resistance distributions after drift without and with stress trim operations, respectively. Dynamic reference can be used to distinguish between two resistance ranges representing two logic states for MLC (multi-level cell) PCM (phase change memory) cells. The difficulty of placing a dynamic reference between two resistance ranges of memory cells over the life cycle of the memory cells increases with wider resistance distribution, as a margin between the two resistance ranges decreases over the life cycle of the memory cells. Stress trim operations as described herein can narrow resistance distribution. As shown in the examples of FIGS. 14A and 14B, R-I (resistance-current) curves for memory cells are more dispersed without stress trim operations as shown in FIG. 14A than with stress trim operations as shown in FIG. 14B, or R-I (resistance-current) curves for memory cells are more aligned with stress trim operations than without stress trim operations.

As shown in the cell resistance vs time graph in FIG. 14A, without stress trim operations, resistance ranges representing two intermediate MLC states of memory cells (e.g. state 1 and state 2) are more likely to increase over time such that a margin between the resistance ranges decreases over time, and consequently it is more difficult to place a dynamic reference between the resistance ranges. In contrast, as shown in the cell resistance vs time graph in FIG. 14B, with stress trim operations, resistance ranges representing two intermediate MLC states of memory cells (e.g. state 1 and state 2) are less likely to increase over time such that a margin between the resistance ranges is less likely to decrease over time, and consequently it is easier to place a dynamic reference between two resistance ranges.

Figures 15A, 15B, 15C:
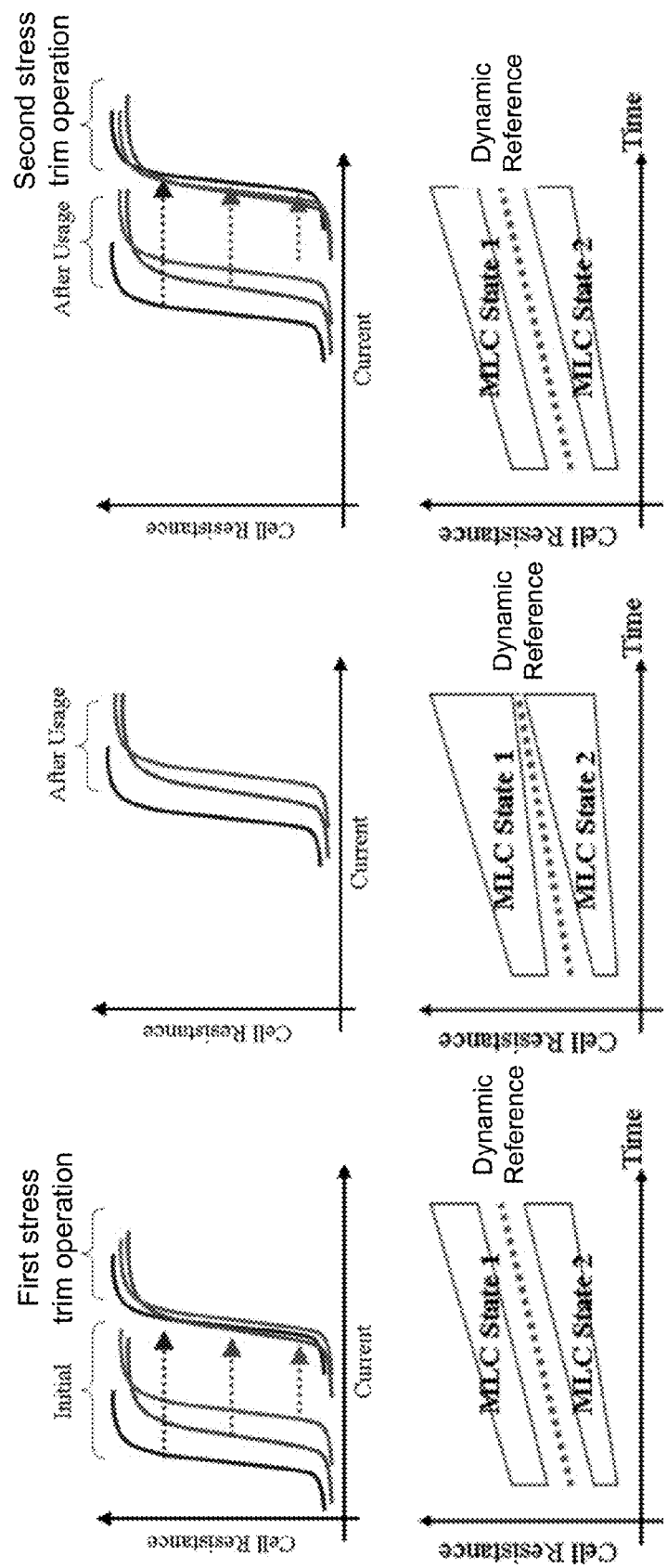
FIGS. 15A, 15B and 15C illustrate stress trim operations applied multiple times over the life cycle of the memory cells.

FIGS. 15A, 15B and 15C illustrate stress trim operations applied multiple times over the life cycle of the memory cells. Each of FIGS. 15A, 15B and 15C includes an upper chart showing R-I curves, and a lower chart showing resistance ranges over time. The upper chart in FIG. 15A shows that more dispersed R-I curves for memory cells become more aligned after a first stress trim operation. The lower chart in FIG. 15A shows that corresponding to the more aligned R-I curves, resistance ranges representing two states of memory cells (e.g. state 1 and state 2) are less likely to increase such that a margin between the resistance ranges is less likely to decrease over time, and consequently it is easier to place a dynamic reference between the resistance ranges.

The upper chart in FIG. 15B shows that after more usage (e.g. program/erase cycles) after the first stress trim operation, the aligned R-I curves after the first stress trim operation can become more dispersed. The lower chart in FIG. 15B shows that corresponding to the more dispersed R-I curves in the upper chart in FIG. 15B, resistance ranges representing two states of memory cells (e.g. state 1 and state 2) are more likely to increase such that a margin between the resistance ranges is more likely to decrease over time, and consequently it is more difficult to place a dynamic reference between the resistance ranges.

The upper chart in FIG. 15C shows that more dispersed R-I curves for memory cells after more usage as shown in FIG. 15B can become more aligned again after a second stress trim operation. The lower chart in FIG. 15C shows that corresponding to the more aligned R-I curves, resistance ranges representing two states of memory cells (e.g. state 1 and state 2) are less likely to increase such that a margin between the resistance ranges is less likely to decrease over time, and consequently it is easier to place a dynamic reference between the resistance ranges.

In general, over the life cycle of a PCM product, stress trim operations can be applied multiple times to align the R-I curves and to make it less likely for a margin between two resistance ranges from decreasing such that it is easier to place a dynamic reference between the resistance ranges.

Figure 16A:
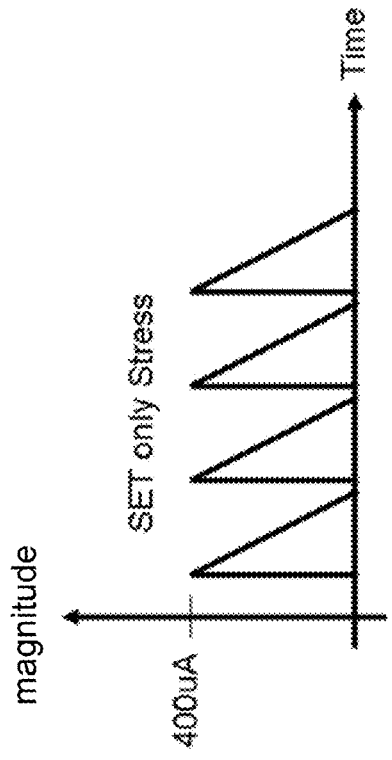
FIGS. 16A, 16B, 16C and 16D illustrate waveforms that can be used for stress pulses in the stress sequence.
Figure 16B:
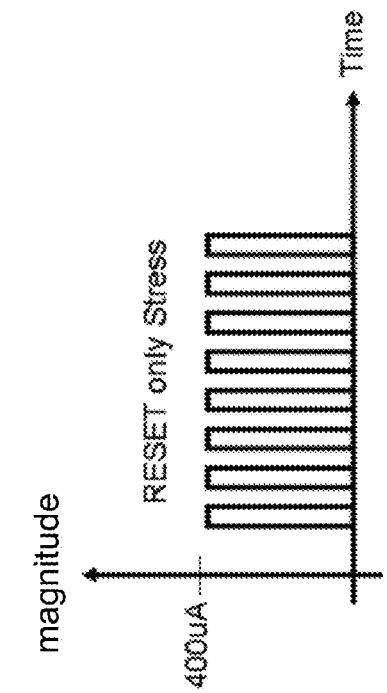
Figure 16C:
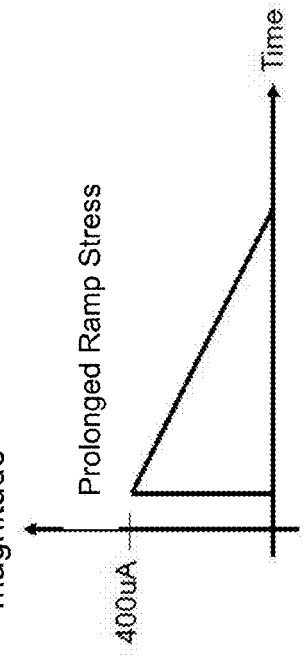
Figure 16D:
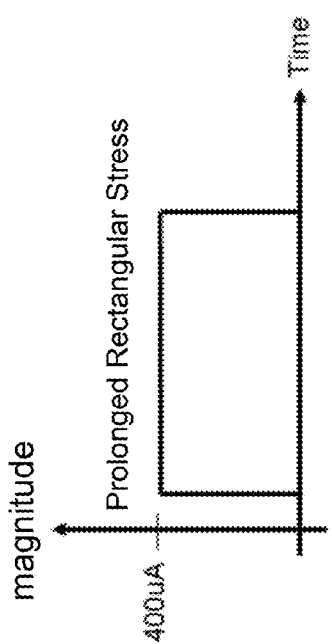

FIGS. 16A, 16B, 16C and 16D illustrate waveforms that can be used for stress pulses in the stress sequence. FIG. 16A illustrates square waveforms that can be used to reset memory cells into an amorphous phase, where the magnitude of the waveforms can be in voltage or current (e.g. 400 uA). FIG. 16B illustrates triangle waveforms that can be used to set memory cells into a crystalline phase, where the magnitude of the waveforms can be in voltage or current (e.g. 400 uA). FIG. 16C illustrates prolonged rectangular waveforms, where the magnitude of the waveforms can be in voltage or current (e.g. 400 uA) and the width of a prolonged rectangular waveform can be multiple times (e.g. hundreds of times) the width of a square waveform as shown in FIG. 16A. FIG. 16D illustrates prolonged ramp waveforms, where the magnitude of the waveforms can be in voltage or current (e.g. 400 uA) and the width of a prolonged ramp waveform can be multiple times (e.g. hundreds of times) the width of a triangle waveform as shown in FIG. 16B.

Figures 17A, 17B:
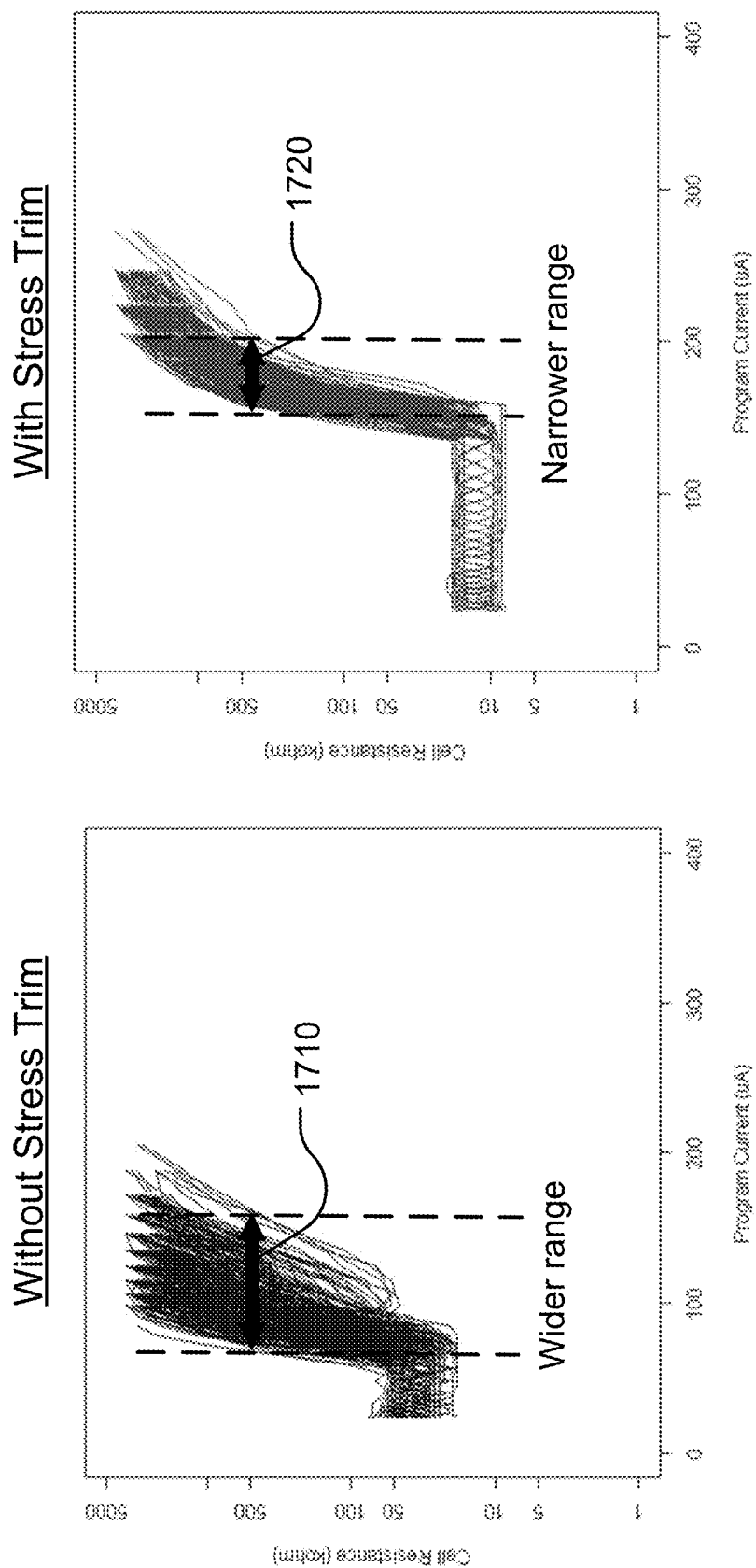
FIGS. 17A and 17B illustrate magnitude ranges for program pulses without and with stress operations.

FIGS. 17A and 17B illustrate magnitude ranges for program pulses without and with stress operations, from experimental results on 1024 memory cells. FIG. 17A illustrates a wider magnitude range (e.g. 1710) for program pulses without stress trim operations, while FIG. 17B illustrates a narrower magnitude range (e.g. 1720) for program pulses with stress trim operations. The magnitude ranges can be in voltage or current. Accordingly, variations in magnitude ranges for program pulses are reduced by stress trim operations.

Figures 18A, 18B:
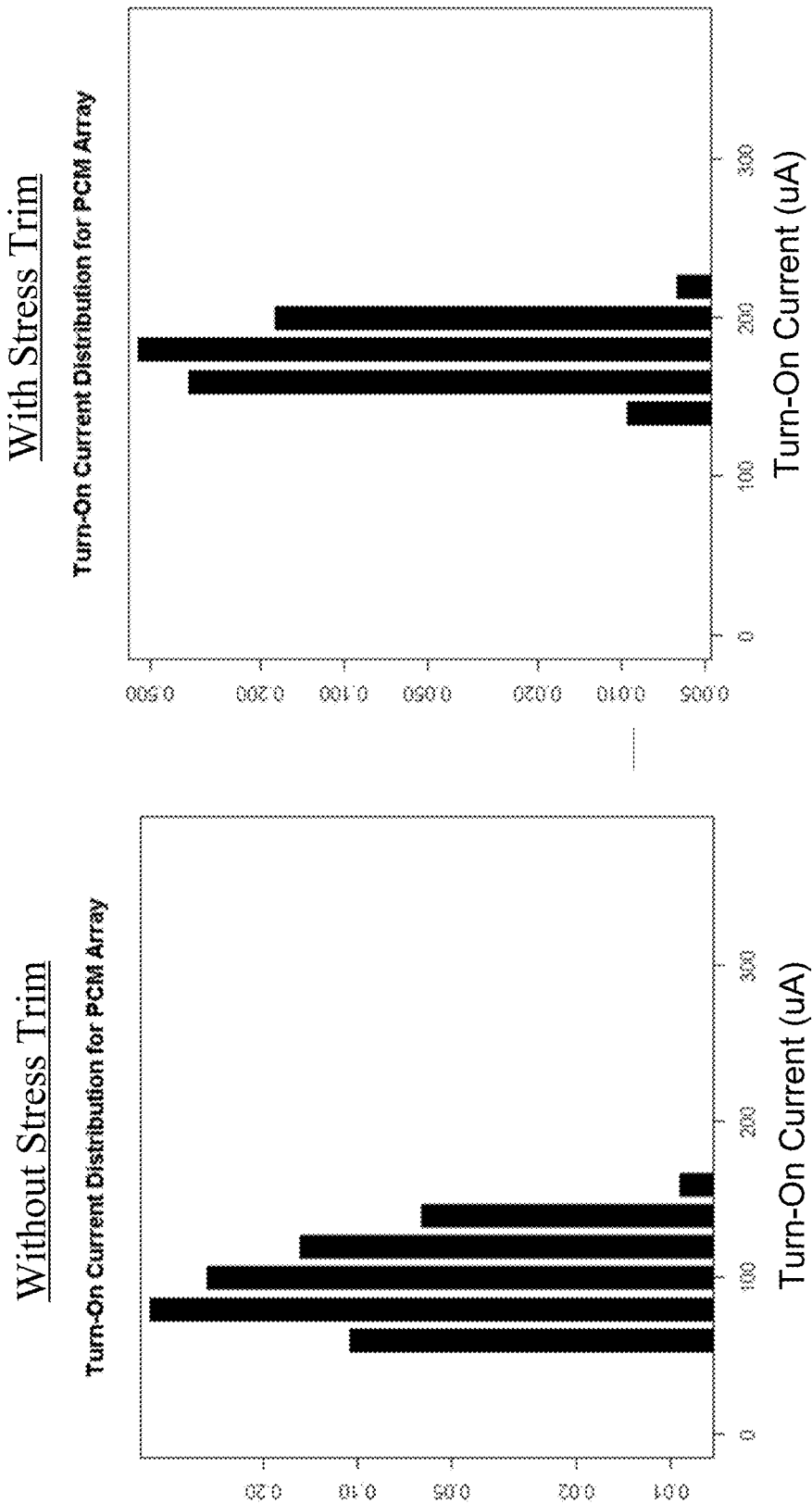
FIGS. 18A and 18B illustrate turn-on current distribution for memory cells without and with stress operations.

FIGS. 18A and 18B illustrate turn-on current distribution for memory cells without and with stress operations, from experimental results on 1024 memory cells, for cell resistance greater than 500 kilo-ohm. FIG. 18A illustrates a wider distribution of turn-on current without stress trim operations, while FIG. 18B illustrates a narrower distribution of turn-on current with stress trim operations. Accordingly, variations in turn-on current are reduced by stress trim operations.

Figure 19B:
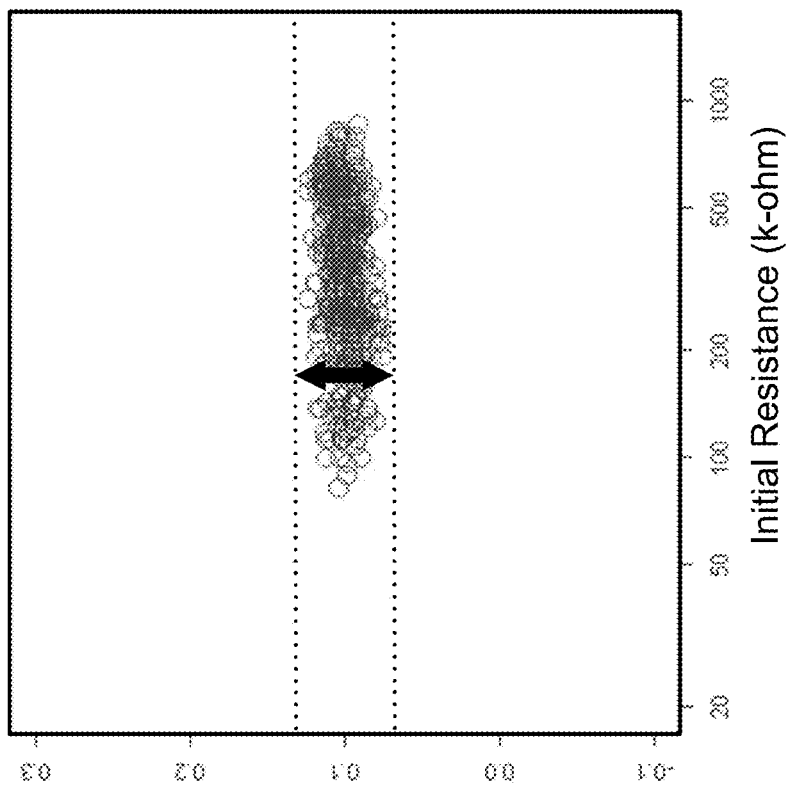
FIGS. 19A and 19B illustrate resistance drift coefficients for memory cells without and with stress operations.
Figure 19A:
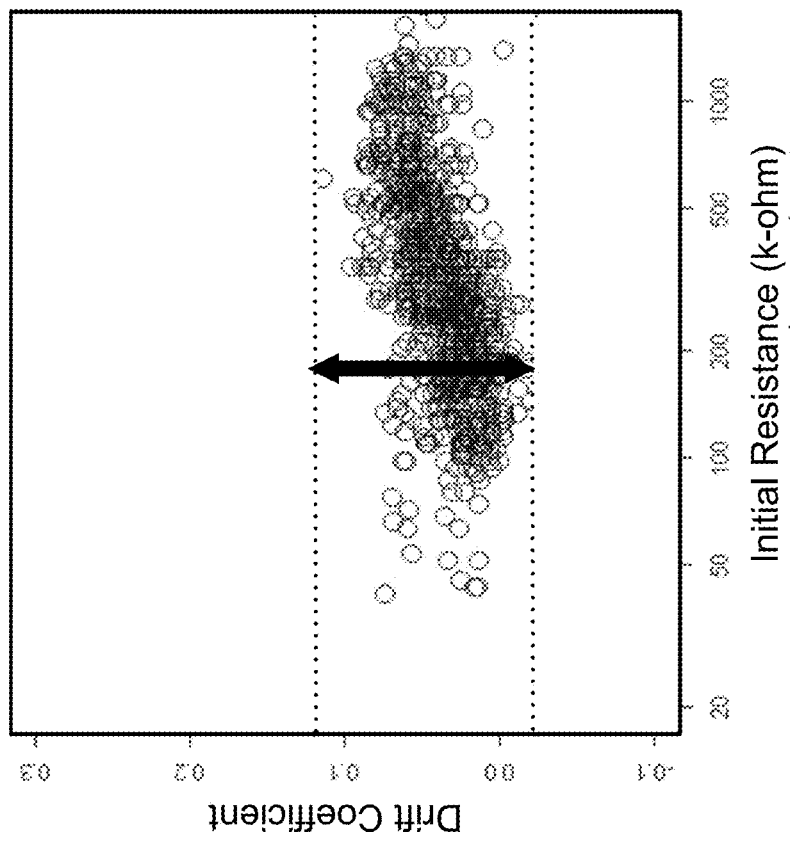

FIGS. 19A and 19B illustrate resistance drift coefficients for memory cells without and with stress operations, from experimental results on 1024 memory cells. FIG. 19A illustrates a wider range of resistance drift coefficients without stress trim operations, while FIG. 19B illustrates a narrower range of resistance drift coefficients with stress trim operations. Accordingly, variations in resistance drift coefficients are reduced by stress trim operations.

Figure 20B:
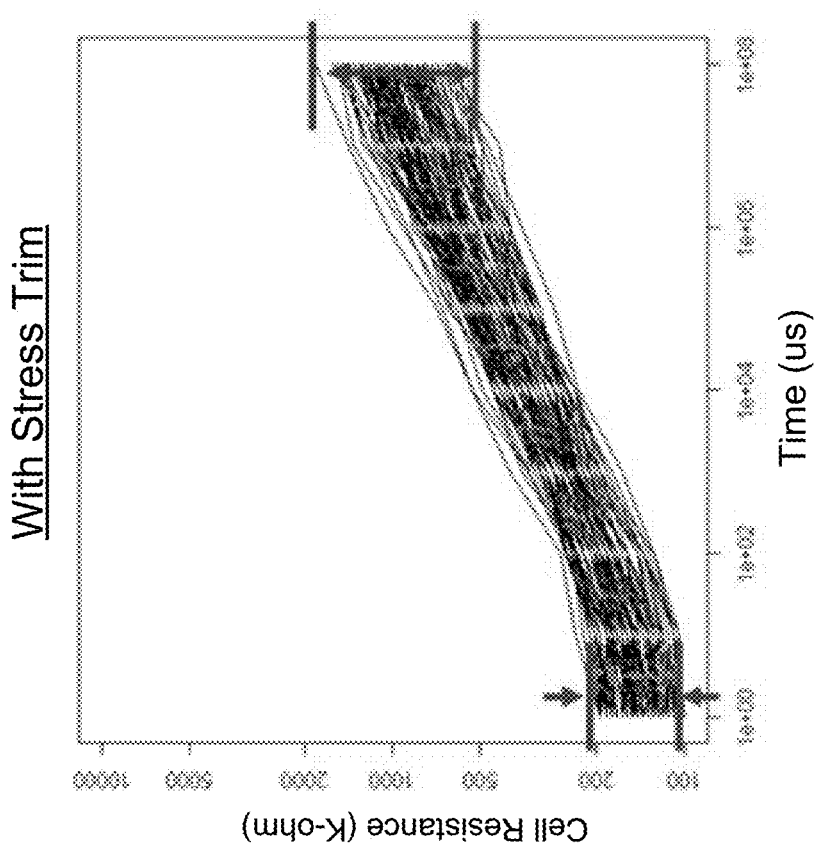
FIGS. 20A and 20B illustrate the resistance drift of an intermediate resistance state without and with stress operations.
Figure 20A:
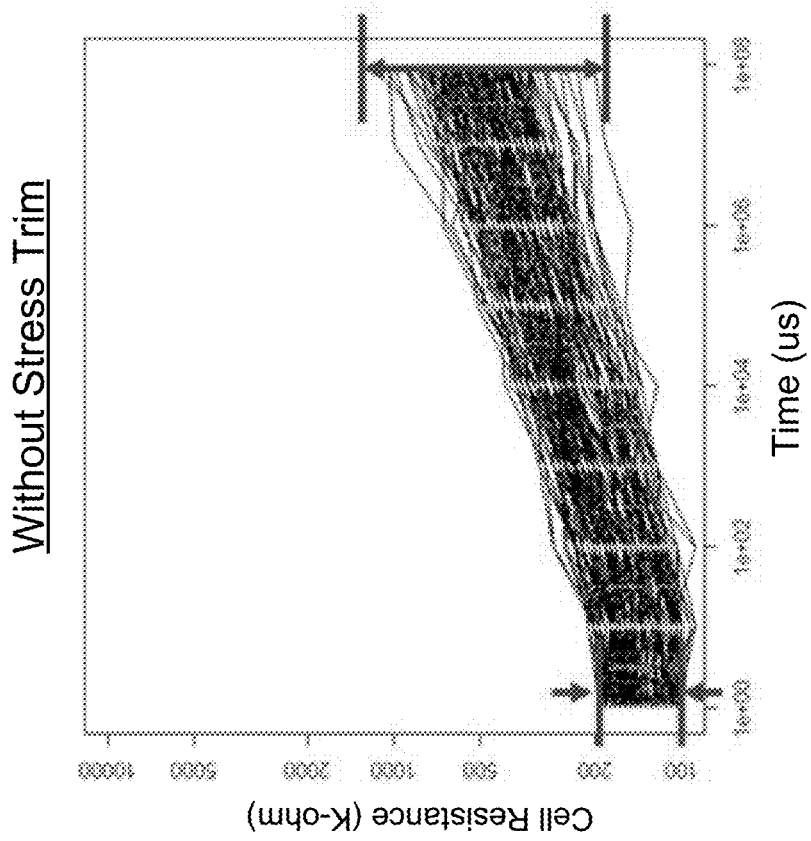

FIGS. 20A and 20B illustrate the resistance drift of an intermediate resistance state, without and with stress operations respectively, from experimental results on two groups of memory cells. FIG. 20A illustrates the resistance drift in a first group of memory cells (e.g. 151 cells) over a period of time, where no stress trim operation is executed on the first group. FIG. 20B illustrates the resistance drift in a second group of memory cells (e.g. 103 cells) over the same period of time, where stress trim operations are executed on the second group. As shown in the example of FIGS. 20A and 20B, Accordingly, resistance drift variations are reduced by stress trim operations.

Figures 21A, 21B:
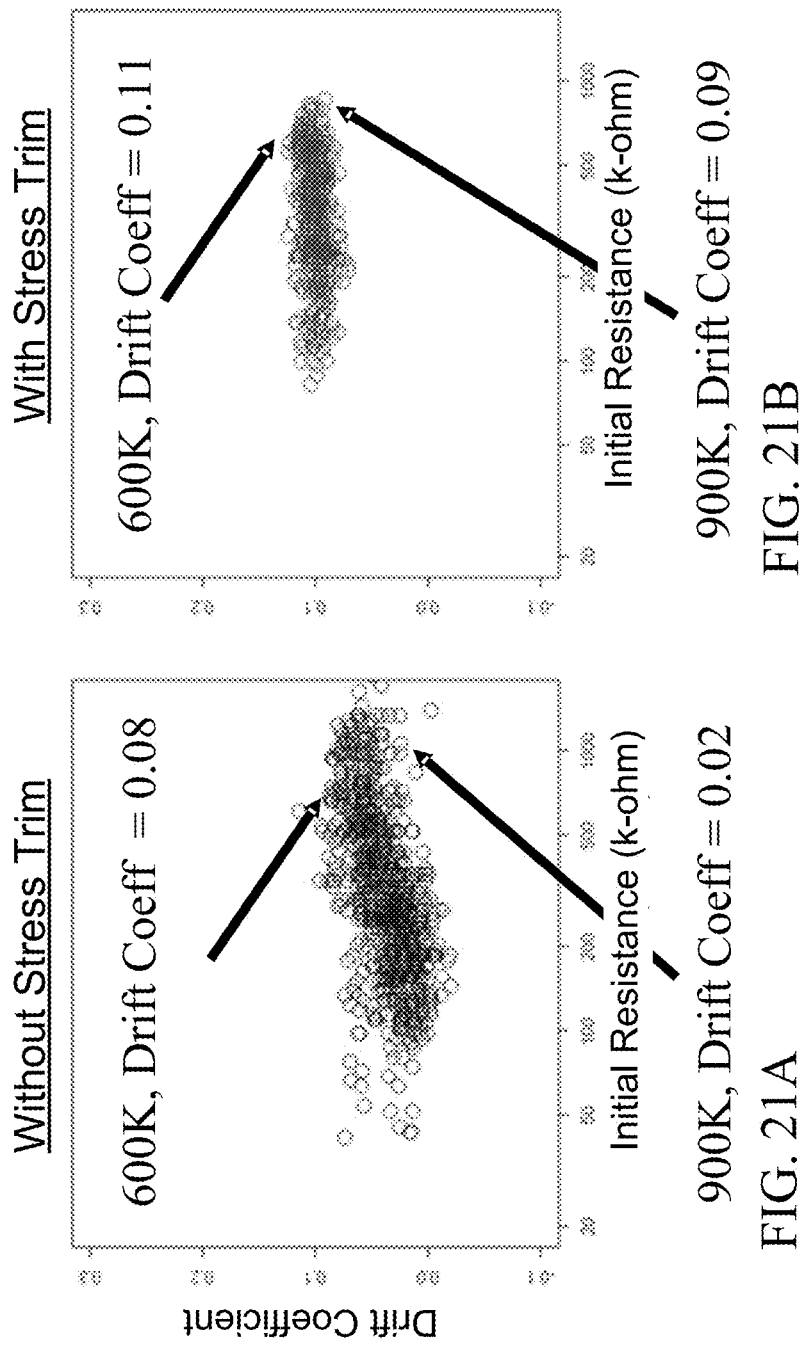
FIGS. 21A and 21B illustrate a worst case retention time estimation.

FIGS. 21A and 21B illustrate a worst case retention time estimation. In reference to the cell resistance vs time graph in FIG. 14A, without stress trim operations, resistance ranges representing two intermediate MLC states of memory cells (e.g. state 1 and state 2) are more likely to increase over time such that a margin between the resistance ranges decreases over time. Description about resistance drift coefficients for memory cells without and with stress operations in connection with FIGS. 19A and 19B is applicable to FIGS. 21A and 21B.

A first intermediate MLC state can have a first target resistance range (e.g. between 500 kilo-ohm and 600 kilo-ohm), and a second intermediate MLC state can have a second target resistance range (e.g. between 900 kilo-ohm to 1000 kilo-ohm). A first memory cell can have resistance corresponding to an upper limit in the first target resistance range (e.g. 600 kilo-ohm), and a largest resistance drift coefficient. A second memory cell can have resistance corresponding to a lower limit in the second target resistance range (e.g. 900 kilo-ohm) and a lowest resistance drift coefficient. The time for the first memory cell to intersect with the second memory cell in terms of resistance ranges can estimate the worst case retention time.

FIG. 21A shows a resistance drift coefficient of 0.08 at initial resistance of 600 kilo-ohm, and a resistance drift coefficient of 0.02 at initial resistance of 900 kilo-ohm, without stress trim operations. FIG. 21B shows a resistance drift coefficient of 0.11 at initial resistance of 600 kilo-ohm, and a resistance drift coefficient of 0.09 at initial resistance of 900 kilo-ohm, with stress trim operations.

The worst case retention time t can be estimated by solving the equations:

$$R(t)=R_o t^\gamma=600t^{0.08}$$

$$R(t)=R_o t^\gamma=900t^{0.02}$$

$$R(t)=R_o t^\gamma=600t^{0.11}$$

$$R(t)=R_o t^\gamma=900t^{0.09}$$

where R(t) is the resistance at the worst case retention time t, $R_o$ is the initial resistance, and $\gamma$ is resistance drift coefficient. The first two equations are for without stress trim operations with $\gamma$=0.08 and 0.02 respectively, and the next two equations are for stress trim operations with $\gamma$=0.11 and 0.09 respectively.

Solution of the first two equations shows that the worst case retention time t for without stress trim operations is t=860.7 seconds. Solution of the next two equations shows that the worst case retention time t for stress trim operations is t=637,621,500 seconds. Accordingly, a ratio of 740,813 (=637,621,500/860.7) shows the improvement in retention time by applying the stress trim operations as described herein.

Figure 22B:
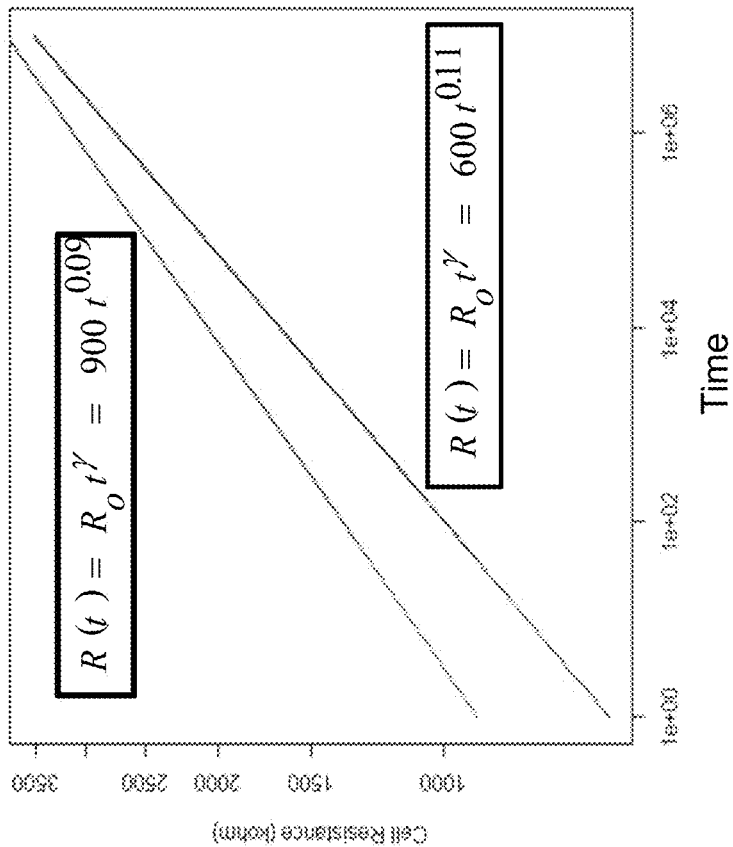
FIGS. 22A and 22B illustrate solving for a worst case retention time graphically.
Figure 22A:
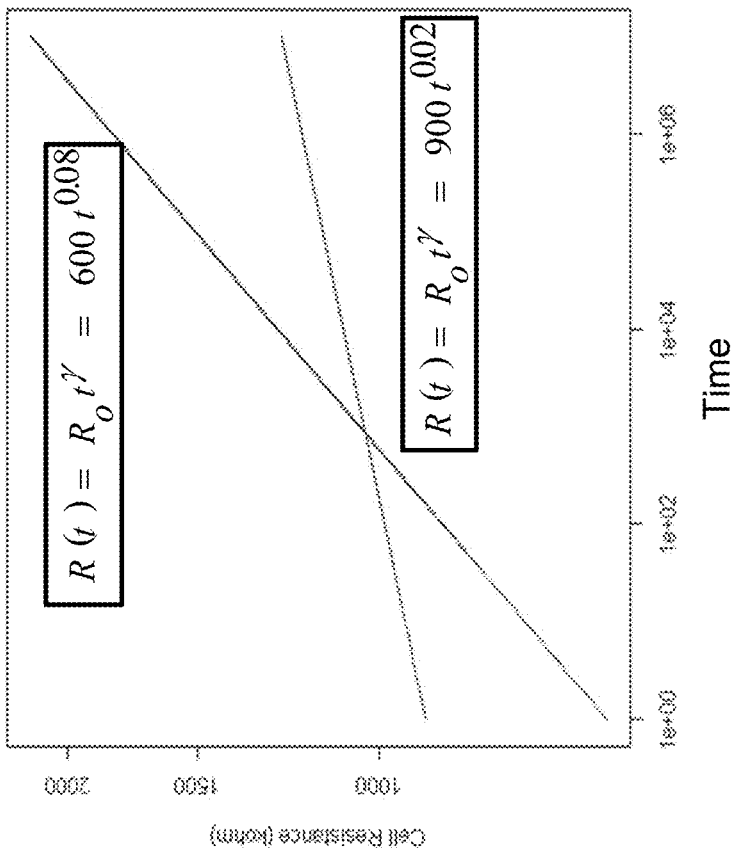

FIGS. 22A and 22B illustrate solving for a worst case retention time graphically. In FIG. 22A, two curves representing the two equations for stress trim operations intersect at time t=860.7 seconds. In FIG. 22B, two curves representing the two equations for without stress trim operations do not intersect in the graph, because the two curves intersect at time t=637,621,500 seconds and the intersection is off the graph.

A memory controller can be coupled to a memory circuit having a set of PCM memory cells. The memory controller can decide when and where to start stress trim operations based on system availability, for example during a system idle time or on a portion of the set of phase change memory cells not storing valid data. The memory controller can include a module controller in an operating system, a storage system controller in an SD (secure digital) card, and an eMMC (embedded Multi-Media Controller), or any hardware responsible for controlling the PCM memory cells on the memory circuit.

The memory controller can issue a command to the memory circuit to perform stress trim operations on all or some of the PCM memory cells in the memory circuit. In response to the command, the memory circuit can first receive the stress statistics and program statistics stored on registers in the memory circuit or external to the memory circuit, and then perform stress trim operations using the stress statistics and program statistics.

During the stress trim operations, some or all PCM memory cells in the memory circuit may be busy and not available for use by a memory controller external to the memory circuit. In case urgent access is needed to the memory circuit, the memory controller can issue a command to the memory circuit to stop the stress trim operations on the PCM memory cells in the memory circuit. This command can be referred to as an interrupt command.

The memory controller can issue a command to the memory circuit to request stress statistics stored in the memory circuit. In response to the command, the memory circuit can provide stress statistics updated by the stress trim operations to the memory controller or a process external to the memory circuit. The stress statistics can include a stress threshold resistance, a stress threshold magnitude, and a stress passing criterion based on the stress threshold resistance and the stress threshold magnitude. The memory controller can receive stress statistics updated by the stress trim operations, and perform memory management functions on the PCM memory cells in the memory circuit using the updated stress statistics. The memory management functions can include wear leveling, hot and cold data allocation, and self-healing of phase change memory cells.

The memory controller can send initial values of the program statistics and the stress statistics for the PCM memory cells in the memory circuit to the memory circuit.

While the present technology is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the technology and the scope of the following claims.

The invention claimed is:

1. A memory circuit, comprising:
a plurality of blocks of memory cells;
a controller including logic to execute program sequences for selected blocks in the plurality of blocks, the program sequences including patterns of program/verify cycles to induce changes in resistance of memory cells to target values representing data;
logic to assign different patterns of program/verify cycles to different blocks in the plurality of blocks, wherein program/verify cycles in the patterns of program/verify cycles in program sequences verify whether memory cells have resistances matching a verify level resistance; and
logic to apply a stress sequence to a selected block in the selected blocks to induce a change in program current levels required to cause resistance changes in memory cells in the selected block, the stress sequence being different than the program sequences.

2. The memory circuit of claim 1, wherein the logic to assign different patterns includes a table accessible by the controller.

3. The memory circuit of claim 1, including logic to change a particular pattern assigned to a particular block in the plurality of blocks.

4. The memory circuit of claim 1, including logic to maintain statistics for blocks in the plurality of blocks, about performance of cells in the blocks in response to the patterns of program/verify cycles assigned to the blocks.

5. The memory circuit of claim 1, including logic to change the pattern of the program/verify cycles assigned to the selected block after the stress sequence.

6. The memory circuit of claim 4, wherein a program sequence in the program sequences includes a sequence of program pulses in program/verify cycles in the program sequence, the sequence of program pulses having a range from a lowest magnitude to a highest magnitude, and wherein the statistics include:
for each block in the plurality of blocks, a set of selected magnitudes in the range, and numbers indicating proportions of memory cells in the block that have resistance passing a verify threshold when program pulses having respective selected magnitudes in the set are applied to the memory cells.

7. The memory circuit of claim 6, wherein each program/verify cycle in the pattern of program/verify cycles in the program sequence includes a first verify that verifies whether memory cells in a selected block in the selected blocks have resistance matching the target resistance, comprising:
logic to apply in particular program/verify cycles in the pattern for the selected block that have a program magnitude matching a selected magnitude in the set of selected magnitudes, a second verify to memory cells in the selected block, in addition to the first verify;
logic to compare resistance of the memory cells in the selected block in a comparison against the verify threshold using the second verify; and
logic to update the numbers with results of said comparison for the selected block.

8. A memory circuit, comprising:
a plurality of blocks of programmable resistance memory cells;
a controller including logic to execute program sequences for selected blocks in the plurality of blocks, the program sequences to induce changes in resistance of memory cells in the blocks to target values representing data, the program sequences including patterns of program/verify cycles; and logic to apply a stress sequence to induce a change in program current levels required to cause resistance changes in memory cells in one of the selected blocks, the stress sequence being different than the program sequences and including stress pulses applied to memory cells in the one of the selected blocks.

9. The memory circuit of claim 8, including logic to maintain statistics for blocks in the plurality of blocks, about performance of cells in the blocks in response to the patterns of program/verify cycles assigned to the blocks; and logic to cause applying the stress sequence in response to the statistics.

10. The memory circuit of claim 8, including logic to maintain statistics for blocks in the plurality of blocks, about performance of cells in the blocks in response to the patterns of program/verify cycles assigned to the blocks, and circuitry to provide the statistics to the controller, and logic to respond to an external command to cause applying the stress sequence.

11. The memory circuit of claim 8, wherein the program sequences comprise an incremental stepped pulse programming sequence.

12. The memory circuit of claim 8, including logic to maintain statistics for blocks in the plurality of blocks, about performance of cells in the blocks in response to the patterns of program/verify cycles assigned to the blocks, wherein a program sequence in the program sequences includes a sequence of program pulses in program/verify cycles in the program sequence, the sequence of program pulses having a range from a lowest magnitude to a highest magnitude, the statistics include, for each block in the plurality of blocks, a set of selected magnitudes in the range, and numbers indicating proportions of memory cells in the block that have resistance passing a verify threshold when program pulses having respective selected magnitudes in the set are applied to the memory cells, comprising:
for each block in the plurality of blocks, logic to determine a threshold magnitude from the set of selected magnitudes, wherein a first proportion of memory cells in the block that have resistance passing a verify threshold when program pulses having the threshold magnitude are applied to the memory cells is greater than a second proportion of memory cells that have resistance not passing the verify threshold when program pulses having the threshold magnitude are applied to the memory cells.

13. The memory circuit of claim 8, including:
logic to verify whether memory cells in the selected block pass a verify threshold when program pulses having a threshold magnitude are applied to the memory cells;
logic to maintain a logical mask indicating results of executing said logic to verify; and
logic to apply said stress pulses to memory cells in the selected block that have resistance not passing the verify threshold as indicated by the logical mask.

14. The memory circuit of claim 8, wherein a program sequence in the program sequences includes a sequence of program pulses in program/verify cycles in the program sequence, the sequence of program pulses having a range from a lowest magnitude to a highest magnitude, wherein the stress sequence is applied to memory cells in the selected block that have resistance not passing a verify threshold when program pulses having a threshold magnitude are applied to the memory cells, the controller including logic to change a particular pattern assigned to a particular block in the plurality of blocks including:
increasing the lowest magnitude of the range, the increased lowest magnitude being lower than or equal to the threshold magnitude.

15. The memory circuit of claim 8, including logic to maintain statistics for blocks in the plurality of blocks, about performance of cells in the blocks in response to the patterns of program/verify cycles assigned to the blocks, wherein a program sequence in the program sequences includes a sequence of program pulses in program/verify cycles in the program sequence, the sequence of program pulses having a range from a lowest magnitude to a highest magnitude, and wherein the statistics include, for each block in the plurality of blocks, a set of selected magnitudes in the range, and numbers indicating proportions of memory cells in the block that have resistance passing a verify threshold when program pulses having respective selected magnitudes in the set are applied to the memory cells, the controller including logic to change a particular pattern assigned to a particular block in the plurality of blocks including:
　　removing a selected magnitude having a lowest value from the set; and
　　adding a new selected magnitude having a value higher than a highest selected magnitude to the set.

16. The memory circuit of claim 8, the controller including logic to respond to an external command to cause stopping the stress sequence.

17. A method for operating a memory circuit comprising a plurality of blocks of memory cells, comprising:
　　executing program sequences for blocks in the plurality of blocks, the program sequences including patterns of program/verify cycles to induce changes in resistance of memory cells to target values representing data;
　　assigning different patterns of program/verify cycles to different blocks in the plurality of blocks, wherein program/verify cycles in the patterns of program/verify cycles in program sequences verify whether memory cells have resistances matching a target resistance; and
　　applying a stress sequence to a selected block in the plurality of blocks to induce a change in program current levels required to cause resistance changes in memory cells in the selected block, the stress sequence being different than the program sequences.

18. The method of claim 17, comprising:
　　changing a particular pattern assigned to a particular block in the plurality of blocks.

19. The method of claim 17, comprising:
　　maintaining statistics for blocks in the plurality of blocks, about whether cells in the block pass verify in particular program/verify cycles in the patterns of program/verify cycles assigned to the blocks.

20. The method of claim 17, comprising:
　　changing the pattern of the program/verify cycles assigned to the selected block after the stress sequence.

21. The method of claim 19, wherein a program sequence in the program sequences includes a sequence of program pulses in program/verify cycles in the program sequence, the sequence of program pulses having a range from a lowest magnitude to a highest magnitude, and wherein the statistics include:
　　for each block in the plurality of blocks, a set of selected magnitudes in the range, and numbers indicating proportions of memory cells in the block that have resistance passing a verify threshold when program pulses having respective selected magnitudes in the set are applied to the memory cells.

22. The method of claim 21, wherein each program/verify cycle in the program/verify cycles in the program sequence includes a first verify that verifies whether memory cells in a selected block in the selected blocks have resistance matching a target resistance representing a logic value, comprising:
　　applying, to the memory cells in the selected block, a second verify in addition to the first verify in particular program/verify cycles in the program sequence that have a program magnitude matching a selected magnitude in the set of selected magnitudes;
　　comparing resistance of the memory cells in the selected block against the verify threshold using the second verify; and
　　updating the numbers with results of said comparing for the selected block.

23. A method for operating a memory circuit comprising a plurality of blocks of memory cells, comprising:
　　executing program sequences for selected blocks in the plurality of blocks, the program sequences including patterns of program/verify cycles;
　　maintaining statistics for blocks in the plurality of blocks, about whether cells in the blocks pass verify in particular program/verify cycles in the patterns of program/verify cycles assigned to the blocks; and
　　applying a stress sequence to induce a change in program current levels required to cause resistance changes in memory cells in one of the selected blocks, the stress sequence being different than the program sequences and including stress pulses applied to memory cells in the one of the selected blocks.

24. The method of claim 23, including causing said applying the stress sequence in response to the statistics.

25. The method of claim 23, including providing the statistics to a controller, and responding to an external command to cause said applying the stress sequence.

26. The method of claim 23, wherein the program sequences comprise an incremental stepped pulse programming sequence.

27. The method of claim 23, wherein a program sequence in the program sequences includes a sequence of program pulses in program/verify cycles in the program sequence, the sequence of program pulses having a range from a lowest magnitude to a highest magnitude, the statistics include, for each block in the plurality of blocks, a set of selected magnitudes in the range, and numbers indicating proportions of memory cells in the block that have resistance passing a verify threshold when program pulses having respective selected magnitudes in the set are applied to the memory cells, comprising:
　　for each block in the plurality of blocks, determining a threshold magnitude from the set of selected magnitudes, wherein a first proportion of memory cells in the block that have resistance passing a verify threshold when program pulses having the threshold magnitude are applied to the memory cells is greater than a second proportion of memory cells that have resistance not passing the verify threshold when program pulses having the threshold magnitude are applied to the memory cells.

28. The method of claim 23, including:
　　verifying whether memory cells in the selected block pass a verify threshold when program pulses having a threshold magnitude are applied to the memory cells;
　　maintaining a logical mask indicating results of executing said verifying; and
　　applying stress pulses to memory cells in the selected block that have resistance not passing the verify threshold as indicated by the logical mask.

29. The method of claim 23, wherein a program sequence in the program sequences includes a sequence of program pulses in program/verify cycles in the program sequence, the sequence of program pulses having a range from a lowest magnitude to a highest magnitude, and wherein the stress sequence is applied to memory cells in the selected block that have resistance not passing a verify threshold when program pulses having a threshold magnitude are applied to the memory cells, comprising changing a particular pattern assigned to a particular block in the plurality of blocks including:
　　increasing the lowest magnitude of the range, the increased lowest magnitude being lower than or equal to the threshold magnitude.

30. The method of claim 23, wherein a program/verify sequence includes a sequence of program pulses in program/verify cycles in the patterns of program/verify cycles, the sequence of program pulses having a range from a lowest magnitude to a highest magnitude, wherein the statistics include, for each block in the plurality of blocks, a set of selected magnitudes in the range, and numbers indicating proportions of memory cells in the block that have resistance passing a verify threshold when program pulses having respective selected magnitudes in the set are applied to the memory cells, comprising changing a particular pattern assigned to a particular block in the plurality of blocks including:

removing a selected magnitude having a lowest value from the set; and adding a new selected magnitude having a value higher than a highest selected magnitude to the set.

31. The method of claim 23, including responding to an external command to cause stopping the stress sequence.

\* \* \* \* \*